(12) United States Patent
Bauer et al.

(10) Patent No.: US 6,509,832 B1
(45) Date of Patent: Jan. 21, 2003

(54) SYSTEMS AND COMPONENTS FOR ENHANCING REAR VISION FROM A VEHICLE

(75) Inventors: Frederick T. Bauer, Holland, MI (US); Lois Bauer, Holland, MI (US); John K. Roberts, East Grand Rapids, MI (US); Joseph S. Stam, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 78 days.

(21) Appl. No.: 09/724,117

(22) Filed: Nov. 28, 2000

Related U.S. Application Data

(62) Division of application No. 09/153,654, filed on Sep. 15, 1998.

(51) Int. Cl.[7] .................................................. B60Q 1/00
(52) U.S. Cl. .................... 340/425.5; 340/436; 340/903; 348/148
(58) Field of Search .............................. 340/425.5, 436, 340/435, 901, 903; 348/148

(56) References Cited

U.S. PATENT DOCUMENTS

| | | |
|---|---|---|
| 3,875,456 A | 4/1975 | Kano et al. |
| 4,211,955 A | 7/1980 | Ray |

(List continued on next page.)

FOREIGN PATENT DOCUMENTS

| | | |
|---|---|---|
| DE | 3916875 | 12/1990 |
| EP | 0244230 | 11/1987 |
| EP | 0417397 | 3/1991 |
| EP | 0573235 | 12/1993 |
| EP | 0625793 | 9/1998 |
| EP | 0689000 | 9/1998 |
| GB | 2313973 | 12/1997 |
| JP | 62-18775 | 1/1987 |
| JP | 62-235787 | 10/1987 |
| JP | 9-207664 | 8/1997 |
| WO | 96 38319 | 12/1996 |
| WO | 97 17800 | 5/1997 |

OTHER PUBLICATIONS

Yadid–Pecht, Orly et al., "Image Sensors With Individual Pixel Reset," *NASA Tech Briefs*, Nov. 1996 (2 pages).
Yadid–Pecht, Orly et al., "Readout Schemes to Increase Dynamic Ranges of Image Sensors," *NASA Tech Briefs*, Jan. 1997 (2 pages).
Fossum, Eric R., "Low Power Camera–on–a–Chip Using CMOS Active Pixel Sensor Technology," *1995 Symposium on Low Power Electronics*, Oct. 9–10, 1995, San Jose, California (pp. 1–4).

(List continued on next page.)

*Primary Examiner*—Nina Tong
(74) *Attorney, Agent, or Firm*—Price, Heneveld, Cooper, DeWitt & Litton; Brian J. Rees

(57) ABSTRACT

A vehicle system is disclosed that includes a vehicle lamp assembly including a plurality of LEDs that emit white light so as to function as an illuminator light. The lamp assembly also may include a plurality of LEDs that emit colored light, such as red or red-orange, so as to function as a signal light. Alternatively or additionally, the lamp assembly may include a camera of a vehicle imaging system. The lamp assembly may serve as a center high mounted stop light or as a tail light. The system also includes a controller that rapidly pulses the LEDs on and off at a rate that is imperceivable by the human eye. The pulsing intervals of the LEDs may be related to the readout intervals of the camera sensor array. In this manner, the LEDs may be pulsed on during camera readout so as to increase their intensity while the camera is capturing an image, or may be pulsed off during camera readout to prevent feedback glare from interfering with image capture by a highly sensitive image sensor array of the camera.

13 Claims, 16 Drawing Sheets

U.S. PATENT DOCUMENTS

| | | | |
|---|---|---|---|
| 4,214,266 A | | 7/1980 | Myers |
| 4,256,372 A | | 3/1981 | Yasukuni et al. |
| 4,277,804 A | | 7/1981 | Robison |
| 4,298,869 A | | 11/1981 | Okuno |
| 4,377,768 A | | 3/1983 | Gallaro et al. |
| 4,450,512 A | | 5/1984 | Kristofek |
| 4,554,587 A | | 11/1985 | Ooi et al. |
| 4,580,196 A | | 4/1986 | Task |
| 4,631,516 A | | 12/1986 | Clinker |
| 4,646,210 A | | 2/1987 | Skogler et al. |
| 4,647,975 A | | 3/1987 | Alston et al. |
| 4,667,177 A | | 5/1987 | Athalye |
| 4,733,336 A | | 3/1988 | Skogler et al. |
| 4,734,697 A | | 3/1988 | Robinson et al. |
| 4,807,096 A | | 2/1989 | Skogler et al. |
| 4,849,803 A | | 7/1989 | Yamamoto et al. |
| 4,863,130 A | * | 9/1989 | Marks, Jr. ............... 248/205.3 |
| 4,868,542 A | | 9/1989 | Thompson |
| 4,882,565 A | | 11/1989 | Gallmeyer |
| 4,891,624 A | | 1/1990 | Ishikawa et al. |
| 4,893,112 A | | 1/1990 | Hatcher |
| 4,896,136 A | | 1/1990 | Hotovy |
| 4,902,108 A | | 2/1990 | Byker |
| 4,910,591 A | | 3/1990 | Petrossian et al. |
| 4,917,477 A | | 4/1990 | Bechtel et al. |
| 4,928,084 A | | 5/1990 | Reiser |
| 4,929,866 A | | 5/1990 | Murata et al. |
| 4,947,291 A | | 8/1990 | McDermott |
| 4,985,816 A | | 1/1991 | Seko et al. |
| 4,992,704 A | | 2/1991 | Stinson |
| 5,001,609 A | | 3/1991 | Gardner et al. |
| 5,008,595 A | | 4/1991 | Kazar |
| 5,027,200 A | | 6/1991 | Petrossian et al. |
| 5,038,258 A | | 8/1991 | Koch et al. |
| 5,083,192 A | | 1/1992 | Rzeznik et al. |
| 5,121,200 A | | 6/1992 | Choi |
| 5,126,926 A | | 6/1992 | Chiang Wen |
| 5,136,483 A | | 8/1992 | Schöniger et al. |
| 5,143,433 A | | 9/1992 | Farrell |
| 5,194,957 A | | 3/1993 | Kyuma |
| 5,241,457 A | | 8/1993 | Sasjima et al. |
| 5,255,171 A | | 10/1993 | Clark |
| 5,260,731 A | * | 11/1993 | Baker, Jr. ................ 224/556 |
| 5,289,082 A | | 2/1994 | Komoto |
| 5,289,321 A | | 2/1994 | Secor |
| 5,303,037 A | | 4/1994 | Taranowski |
| 5,307,136 A | | 4/1994 | Saneyoshi |
| 5,325,271 A | | 6/1994 | Hutchisson |
| 5,371,659 A | | 12/1994 | Pastrick et al. |
| 5,384,519 A | | 1/1995 | Gotoh |
| 5,387,958 A | | 2/1995 | Pashley |
| 5,414,461 A | | 5/1995 | Kishi et al. |
| 5,471,515 A | | 11/1995 | Fossum et al. |
| 5,477,436 A | | 12/1995 | Bertling et al. |
| 5,490,049 A | | 2/1996 | Montalan et al. |
| 5,495,243 A | | 2/1996 | McKenna |
| 5,497,305 A | | 3/1996 | Pastrick et al. |
| 5,497,306 A | | 3/1996 | Pastrick |
| 5,550,677 A | | 8/1996 | Schofield et al. |
| 5,555,069 A | | 9/1996 | Albrecht et al. |
| 5,564,819 A | | 10/1996 | Yamaguchi |
| 5,613,751 A | | 3/1997 | Parker et al. |
| 5,631,704 A | | 5/1997 | Dickinson et al. |
| 5,646,614 A | | 7/1997 | Abersfelder et al. |
| 5,670,935 A | | 9/1997 | Schofield et al. |
| 5,680,123 A | * | 10/1997 | Lee ........................... 340/435 |
| 5,699,044 A | | 12/1997 | Van Lente et al. |
| 5,765,940 A | | 6/1998 | Levy et al. |
| 5,798,691 A | | 8/1998 | Kao |
| 5,803,579 A | * | 9/1998 | Turnbull et al. ............ 362/230 |
| 5,836,676 A | | 11/1998 | Ando et al. |
| 5,865,529 A | | 2/1999 | Yan |
| 5,895,115 A | | 4/1999 | Parker et al. |
| 5,904,330 A | * | 5/1999 | Manico et al. ........... 119/51.01 |
| 5,949,346 A | | 9/1999 | Suzuki et al. |
| 6,038,496 A | | 3/2000 | Dobler et al. |
| 6,132,072 A | * | 10/2000 | Turnbull et al. ............ 362/230 |
| 6,175,300 B1 | * | 1/2001 | Kendrick ..................... 340/435 |
| 6,246,933 B1 | * | 6/2001 | Bague ......................... 340/438 |
| 6,259,475 B1 | | 7/2001 | Ramachandran et al. |
| 6,262,764 B1 | * | 7/2001 | Perterson .................... 348/148 |
| 6,304,173 B2 | * | 10/2001 | Pala et al. .................. 340/461 |

OTHER PUBLICATIONS

Fossum, Eric R., "Active Pixel Sensors: Are CCD's Dinosaurs?," *SPIE*, vol. 1900 (pp. 2–14).

Mendis, Sunetra K., "Low–Light–Level Image Sensor With On–Chip Signal Processing," *SPIE*, vol. 1952, pp. 23–33.

SAE J578, Surface Vehicle Standard—Color Specification, revised Jun. 1995.

English Translation "LED–Baulement" of 2087 Elektronic, vol. 44, No. 15, Jul. 25, 1995, p. 134.

J.L. Schnapf, et al., "Spectral sensitivity of human cone photoreceptors," Nature, vol. 325, Jan. 29, 1987, pp. 439–441.

David H. Brainard, Colorimetry, XP 002040706, Chapter 26, pp. 26.1–26.53.

R.W.G. Hunt, *Measuring Colour*, reprinted in 1992 by Ellis Horwood Limited, pp. 38–79, and 124–133.

Photographs of a CHMSL of a 1995 Ford F150 Pickup Truck.

Photographs of a CHMSL of a 1996 Chevy Blazer.

Photographs of a CHMSL of a 1996 Chrysler Town & Country.

* cited by examiner

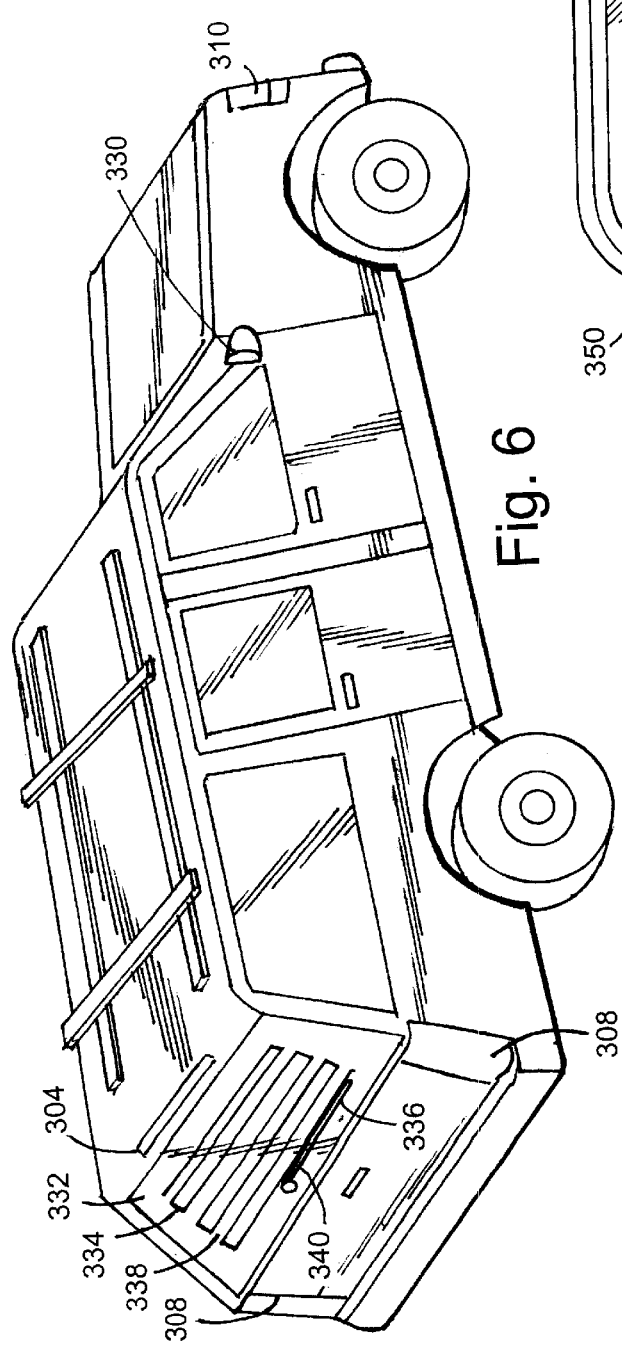
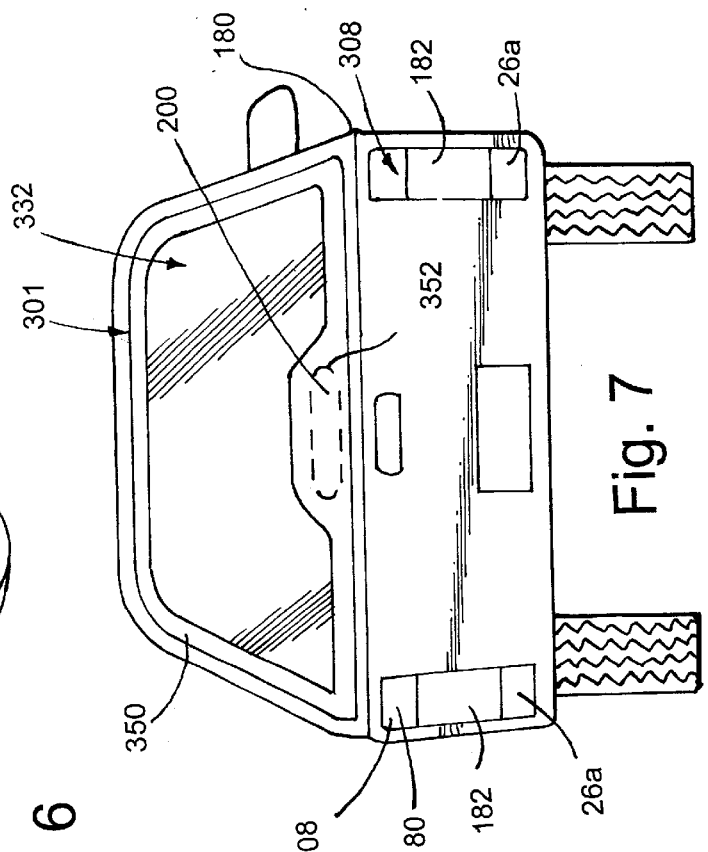

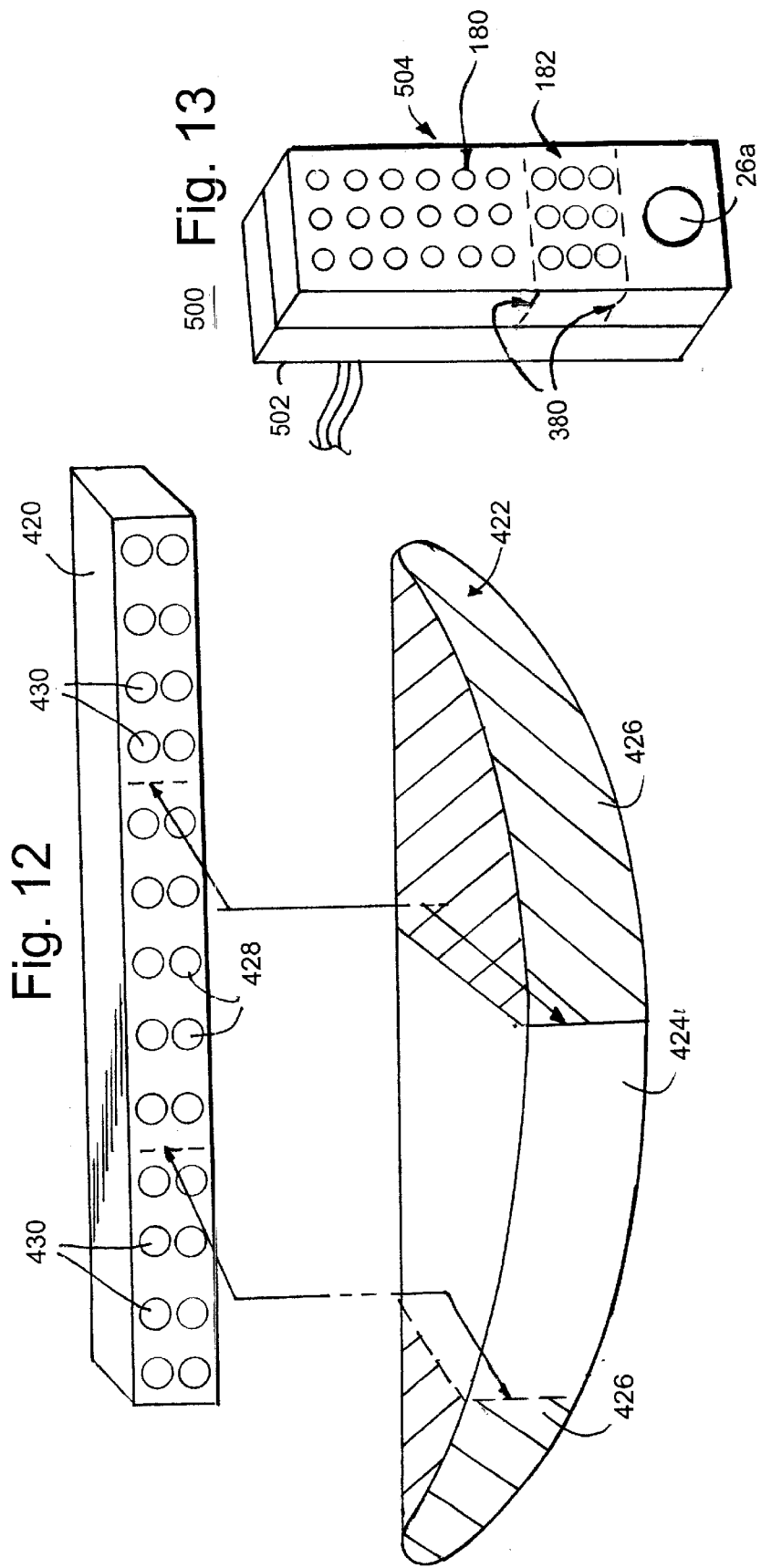

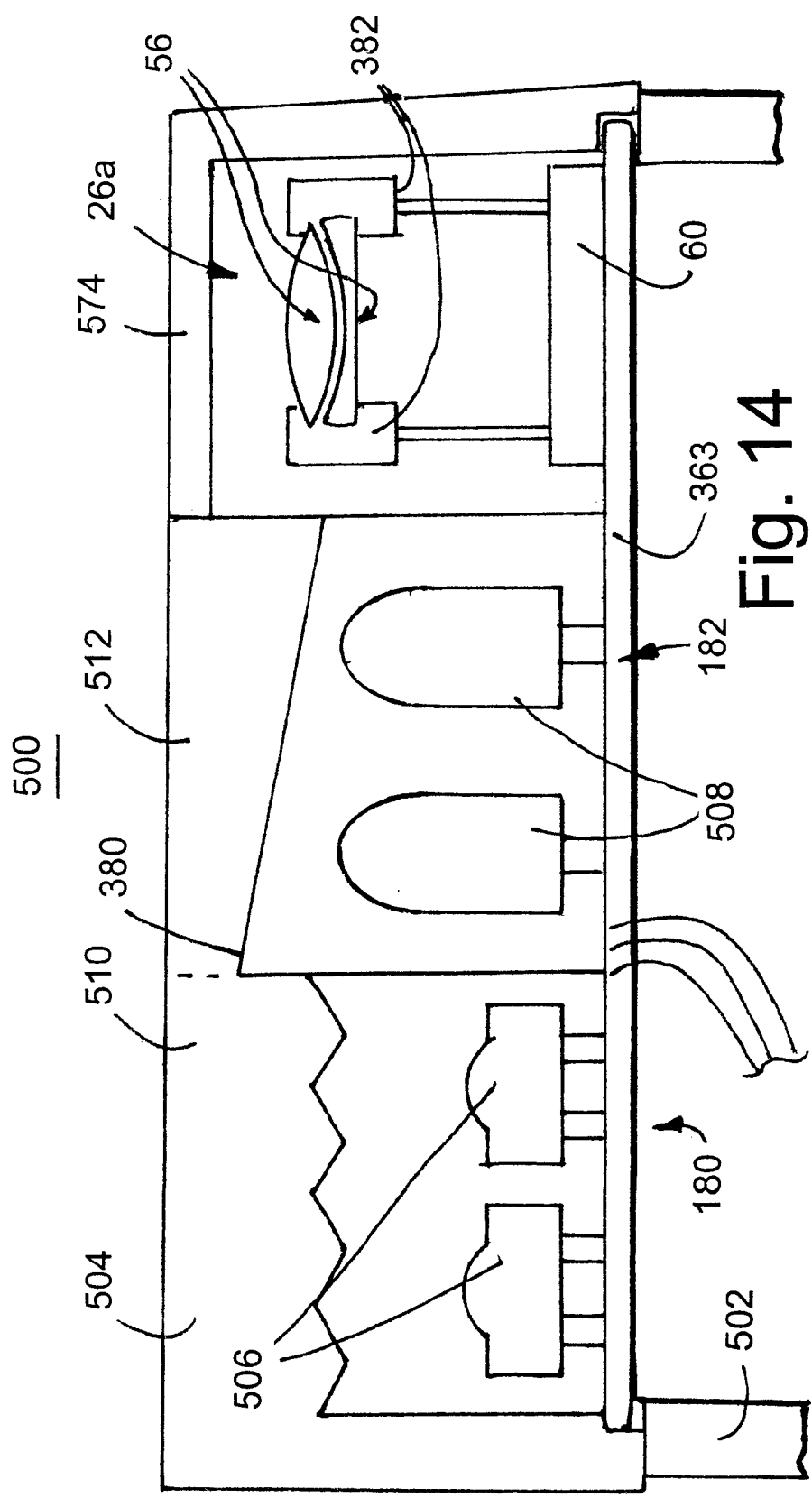

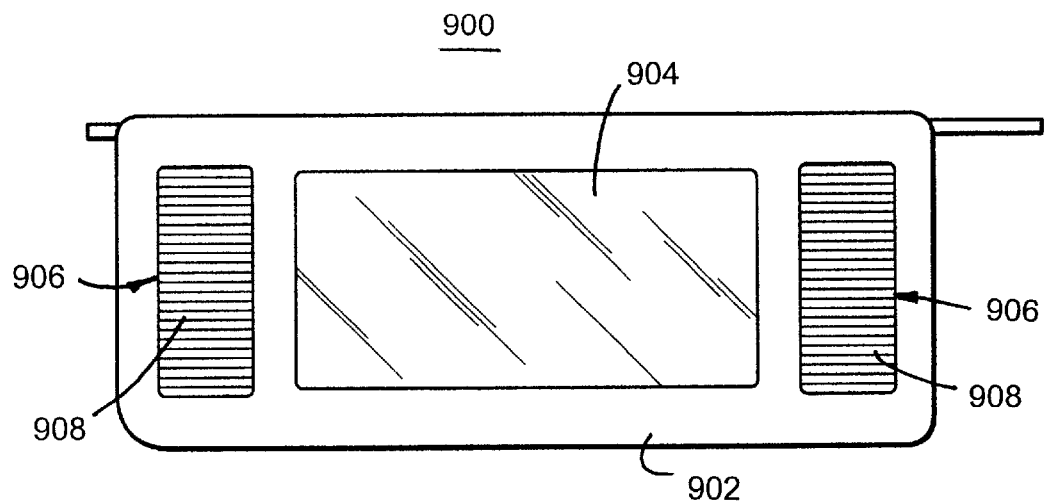
Fig. 25
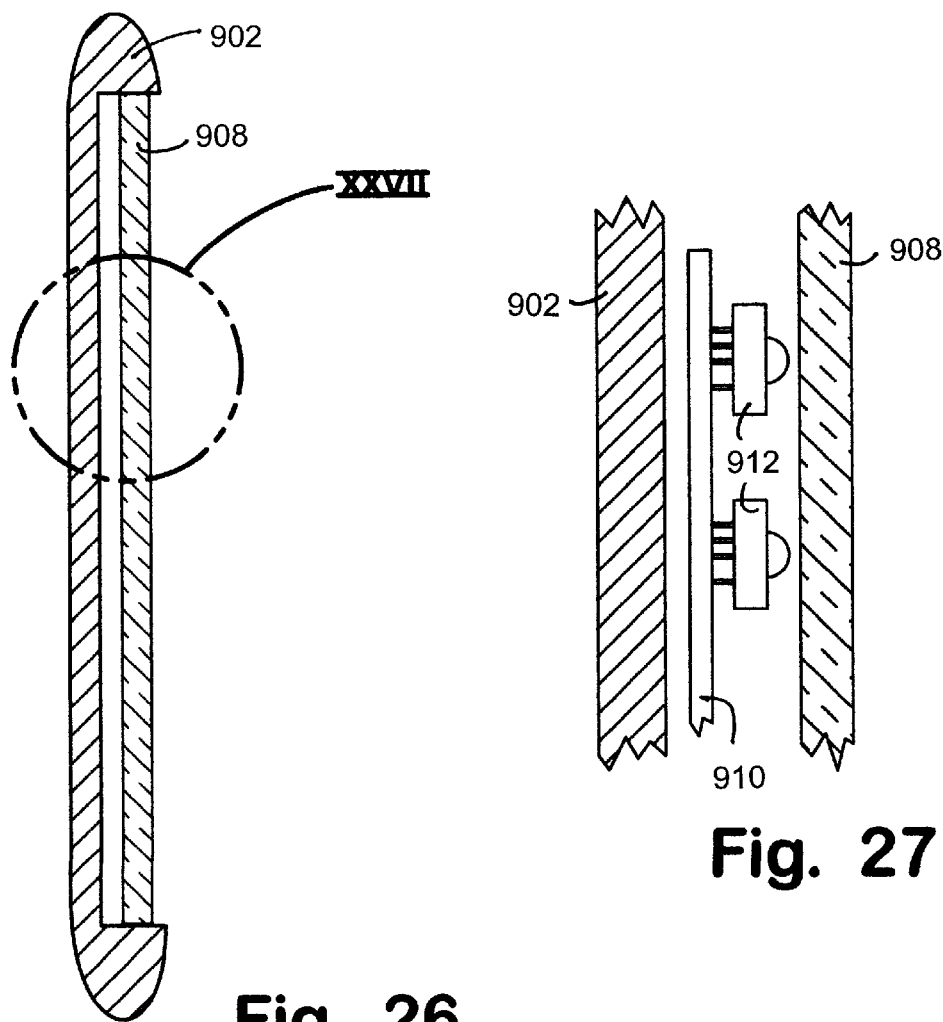
Fig. 26
Fig. 27

SYSTEMS AND COMPONENTS FOR ENHANCING REAR VISION FROM A VEHICLE

CROSS-REFERENCE TO RELATED APPLICATIONS

This application is a divisional application of U.S. patent application Ser. No. 09/153,654, entitled SYSTEMS AND COMPONENTS FOR ENHANCING REAR VISION FROM A VEHICLE, filed on Sep. 15, 1998, by Frederick T. Bauer et al. The disclosure of the above application is incorporated herein by reference.

BACKGROUND OF THE INVENTION

The present invention generally relates to systems and devices for enhancing rear vision from a vehicle. More specifically, the present invention relates to vehicle exterior illumination systems, vehicle visual signaling systems, and/or electronic rear vision systems.

Privacy glass has recently become a very popular option for vehicles due to its aesthetic appearance, reduction of solar loading, and due to a belief that the privacy glass provides some deterrence to a carjacker who consequently cannot see who the driver is, who else may be in the vehicle, or whether there may be a dog in the vehicle. The use of privacy glass, however, introduces many safety concerns. Currently, privacy glass is allowed on all vehicle windows, with the exception of the front windshield and the side windows of the driver and front passenger. Typical privacy glass has only 15 to 20 percent transmittance. When such privacy glass is used on the rear window of a vehicle, the driver's vision through the rear window is significantly impaired, particularly at night. Because the back-up lights on a vehicle do not provide sufficient illumination to the rear of the vehicle to counter the effects of the privacy glass, the use of privacy glass significantly increases the risk that a driver will accidentally back into or run over something or someone. Therefore, there exists a need for practical systems and/or devices that enhance a driver's rear vision from within a vehicle having privacy glass.

SUMMARY OF THE INVENTION

Accordingly, it is an aspect of the present invention to solve the above problems by providing a vehicle lamp assembly for providing additional illumination to the rear of a vehicle. An additional aspect of the present invention is to provide a vehicle lamp assembly that is relatively inexpensive and does not require frequent replacement of the light source.

To achieve these and other aspects and advantages, a vehicle lamp assembly constructed in accordance with the present invention comprises a support structure for mounting to the rear of a vehicle, a lens mounted to the support structure, and a plurality of LEDs mounted to the support structure behind the lens. The LEDs are selectively activated in response to an activation signal such that substantially white light is emitted from the lens in a rearward direction from the vehicle.

Another aspect of the present invention is to provide a vehicle lamp assembly that provides supplemental illumination while also emitting colored light that may serve as a signal light, such as a brake light or turn signal light. To achieve this and other aspects and advantages, a vehicle signal lamp assembly according to the present invention comprises a support structure for mounting to a vehicle, a lens mounted to the support structure, a first set of LEDs mounted to the support structure behind the lens, and a second set of LEDs mounted to the support structure behind the lens. The first set of LEDs is activated in response to a first activation signal such that colored light is emitted from the lens. The second set of LEDs is selectively activated in response to a second activation signal such that substantially white light is emitted from the lens.

An additional aspect of the present invention is to provide an electronic imaging system for enabling images to the rear of the vehicle to be captured with a camera and displayed to the driver on a display device. Another aspect of the present invention is to mount the camera of the imaging system to the rear of a vehicle in a location that is relatively covert and aesthetically pleasing, and that is very practical and economical from a manufacturing stand point.

To achieve these and other aspects and advantages, an electronic imaging system according to the present invention comprises a support structure for mounting to the rear of a vehicle, a lens mounted to the support structure, a plurality of LEDs mounted to the support structure behind the lens, and a camera mounted to the support structure behind the lens for capturing images to the rear of the vehicle for display to a vehicle operator. The LEDs are selectively activated in response to an activation signal such that radiation is emitted from the lens in a rearward direction from the vehicle.

Still another aspect of the present invention is to integrate a camera of a vehicle imaging system with an existing vehicle component to thereby enable such cameras to be more easily installed in a vehicle. To achieve this and other aspects and advantages, a modular integrated vehicle rear window assembly according to the present invention comprises a rear window and a camera. The camera may be mounted to an inner surface of the rear window so as to capture an image to the rear of the vehicle through the rear window or the camera may be mounted to a window frame structure in which the rear window is mounted.

Yet another aspect of the present invention is to provide a vehicle imaging system that has an enhanced ability to capture images to the rear of the vehicle whether driving forward down the road or backing up. To achieve this aspect and other aspects and advantages, a vehicle imaging system according to the present invention comprises a camera for capturing an image, a radiation source for emitting radiation to which the camera is sensitive within the field of view of the camera, and a controller coupled to the camera and the radiation source for reading the image captured by the camera at periodic intervals and for periodically activating the radiation source during intervals at which the controller is reading the image from the camera. The radiation source may emit infrared radiation while the vehicle is driving forward down a road, and/or may emit visible light when the vehicle is backing up.

Another aspect of the present invention is to reduce the adverse effects a signal light or illumination light may have on a camera that is mounted proximate to the lights. To achieve this and other aspects and advantages, a lighting and electronic imaging system according to the present invention comprises a light source mounted to the vehicle, a camera mounted to the vehicle for capturing images for display to a vehicle operator, and a controller coupled to the camera and to the light source for reading the image captured by the camera at periodic intervals and for periodically activating the light source during those intervals when the controller is not reading images captured by the camera.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 6 is an oblique perspective view of a vehicle in which the present invention is implemented;

FIG. 7 is a rear perspective view of a vehicle in which a first embodiment of the present invention is implemented;

FIG. 12 is an exploded perspective view of the CHMSL assembly shown in FIG. 11;

FIG. 13 is a perspective view of a light/camera assembly constructed in accordance with a third embodiment of the present invention;

FIG. 14 is a cross-sectional view of the light/camera assembly shown in FIG. 13;

FIG. 25 is a perspective view of a sun visor constructed in accordance with another embodiment of the present invention;

FIG. 26 is a cross-sectional view of the sun visor shown in FIG. 25 taken along line XXV—XXV; and FIG. 27 is an enlarged view of the cross section shown in FIG. 26.

DETAILED DESCRIPTION OF THE PREFERRED EMBODIMENTS

Figure 1:
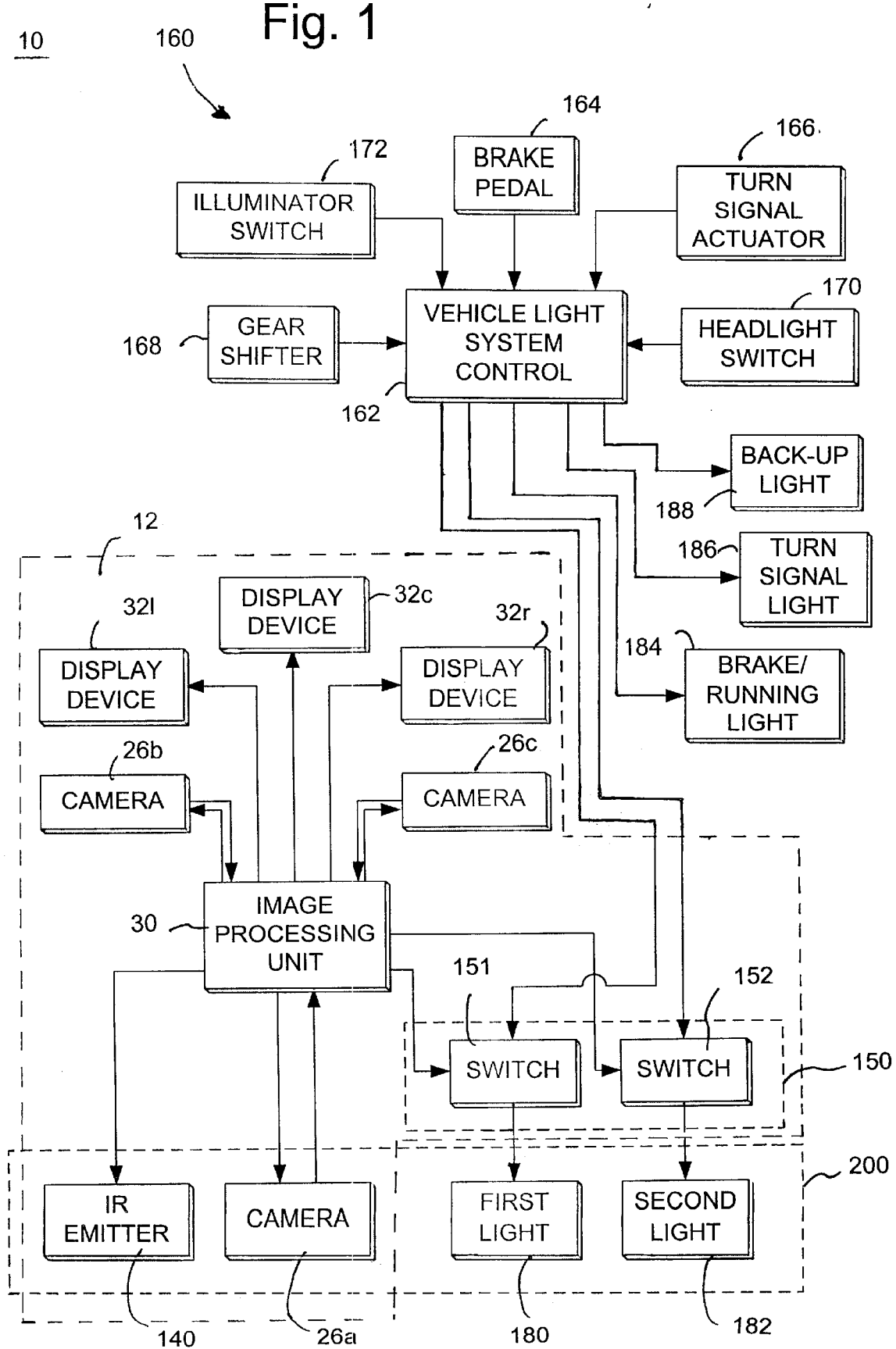
FIG. 1 is an electrical circuit diagram in block form illustrating the system constructed in accordance with the present invention.

FIG. 1 shows a system diagram illustrating the various components constituting the system 10 of the present invention. As illustrated, system 10 includes an electronic imaging subsystem 12. Imaging subsystem 12 includes at least one camera 26a, 26b, and/or 26c; at least one display device 32a, 32b, and/or 32c; and an image processing unit 30. Imaging subsystem 12 may also include an ambient light sensor 34, a direct glare sensor 36, a manual intensity adjustment mechanism 116, and/or an infrared (IR) emitter 140.

System 10 further includes a first light 180 and optionally a second light 182 housed in the same assembly 200 as camera 26a. IR emitter 140 may also be housed in the same integral assembly 200. As described in further detail below, first light 180 may be a signal light such as a brake light, and second light 182 may also be a signal light or an illumination light such as a cargo light for a pick-up truck or a rear illumination light. If, for example, light 180 is the brake light for a CHMSL, assembly 200 may take the form of a CHMSL assembly having an integrated camera 26a and CHMSL brake light. Alternatively, assembly 200 could take the form of a tail light assembly in which light source 180 is a running/brake light. The various physical embodiments of integral assembly 200 are described below following the detailed description of imaging subsystem 12.

As will also be described in more detail below, system 12 preferably includes a switching interface circuit 150 including switches 151 and 152 for controlling the application of activation signals to each of the lights 180 and 182 that are mounted in a common assembly 200 with camera 26a. Switches 151 and 152 are controlled by image processing unit 30 in the manner described below to reduce feedback glare from the light emitted from lights 180 and 182 during operation of camera 26a.

The activation signals applied to lights 180 and 182 may be those applied from a conventional vehicle light system 160. Conventional vehicle light systems typically include some form of vehicle light system control 162 that receives inputs from, for example, a brake pedal 164, a turn signal actuator 166, a gear shifter 168, a head light switch 170, and/or an illuminator switch 172. Vehicle light system control 162 utilizes these inputs to provide power or activation signals to the various signal lights (identified generally as block 184) including the brake lights, turn signal lights, and back-up lights, as well as to the various interior and exterior illuminator lights of the vehicle (identified generally as block 186), such as the head lights and running lights, interior dome and map lamps, and exterior illumination lamps (i.e., cargo and puddle lamps). In its simplest form, vehicle light system control 162 may merely include a plurality of switches for turning the lights on and off.

Imaging Subsystem

Figure 2:
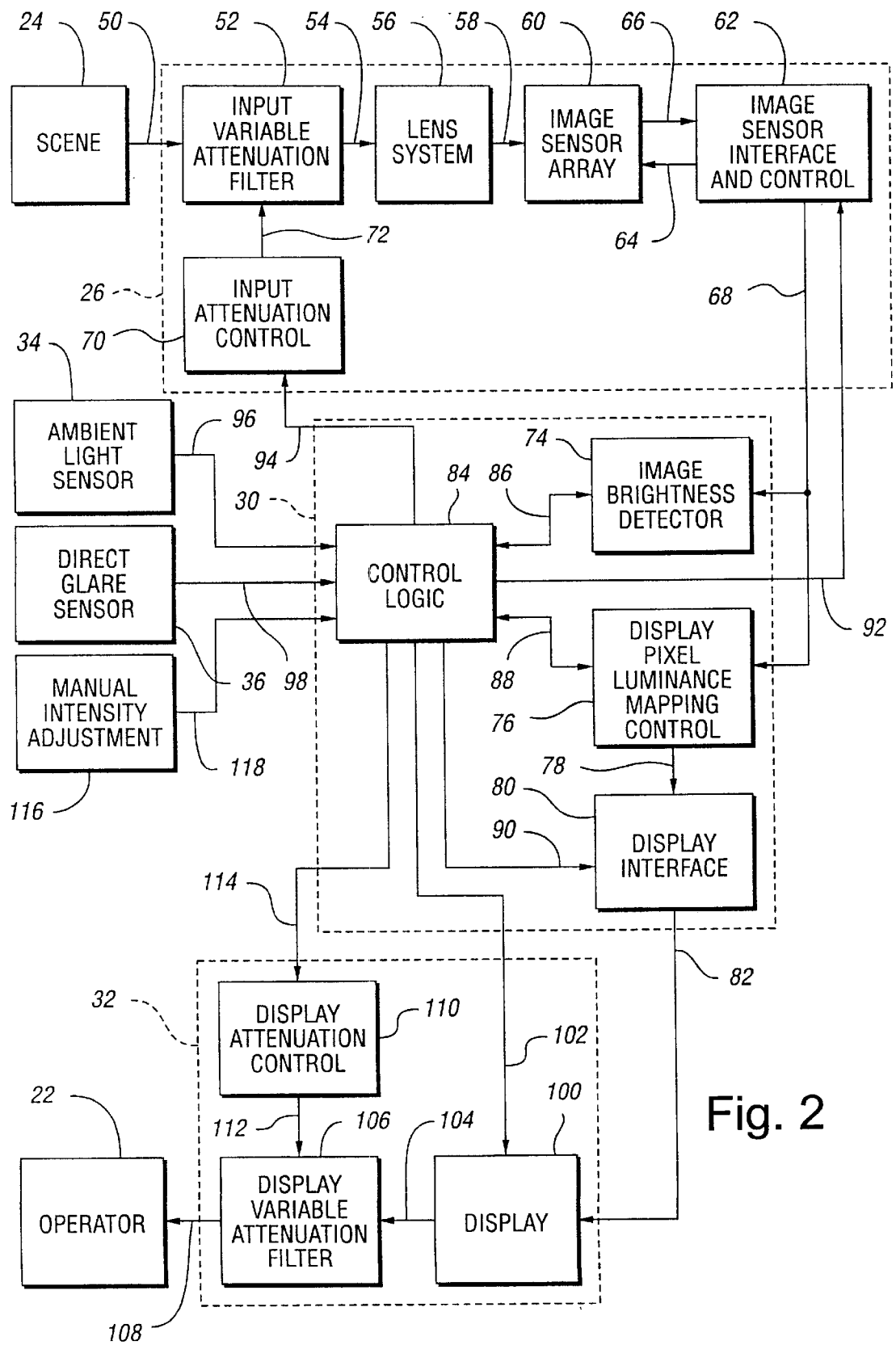
FIG. 2 is an electrical circuit diagram in block form illustrating an electronic vehicle vision subsystem that may be used in the system of the present invention.

Referring to FIG. 2, a preferred imaging subsystem 12 is shown, which is disclosed in detail in commonly-assigned U.S. patent application Ser. No. 09/001,855, entitled VEHICLE VISION SYSTEM, filed on Dec. 31, 1997, by Jon H. Bechtel et al. As shown, a camera system 26 accepts image rays 50 from scene 24. Image rays 50 pass through optional input variable attenuation filter 52 emerging as attenuated image rays 54. Rays 50 or 54 are focused by lens system 56 to become focused rays 58. An image sensor array 60 is placed in the focal plane of lens system 56. The image sensor array is comprised of individual pixel sensors, ideally arranged in rows and columns. An image sensor interface and control unit 62 provides control signals 64 to image sensor array 60 and receives electrical signals 66 corresponding to scene 24 from image sensor array 60. Image sensor interface and control 62 may operate on signals 66, preferably including digitizing the signals prior to forwarding the camera system output signals 68. If optional lens attenuating filter 52 is used, the amount of attenuation is 40 controlled by lens attenuation control 70 through lens attenuation filter signal 72.

In a preferred embodiment, camera system 26 is designed to handle a large dynamic range. A significant improvement over prior systems is the ability of camera system 26 to capture and transmit detail in scene 24 that has previously been obscured due to low illumination levels or due to glare from lights, such as headlamps.

One limitation on the dynamic range of camera system output is due to the pixel sensors in the image sensor array. The preferred embodiment uses complementary metal-oxide semiconductor/metal-on-silicon (CMOS) photogate active pixel sensor (APS) cells. The photogate in each cell is used to integrate charge developed from incident light. A storage site is capable of holding the integrated charge. The storage site can be reset to a reference level indicative of pixel sensor noise. A selectable buffer circuit outputs a signal proportional to the integrated charge or reference value at the storage site. By subtracting the reference noise signal from the integrated charge signal, a significant effect of the noise can be eliminated, increasing pixel sensor sensitivity.

Another limitation on the dynamic range of camera systems has been the restriction on the length of time for integrating charge produced by incident light. Current systems limit the integration time to slightly less than the frame time. Since it is desirable to display scene 24 as near real time, a high frame rate of preferably not less than 30 frames per second is required. Traditionally, this has resulted in integration times of no greater than 33 msecs.

An optical sensor combining image sensor array 60 and image sensor interface and control 62 with a wide dynamic range is described in commonly-assigned U.S. Pat. No. 6,008,486, entitled WIDE DYNAMIC RANGE OPTICAL SENSOR, filed on Dec. 31, 1997, by Joseph S. Stam et al., the disclosure of which is incorporated herein by reference. One method described implements a double integration architecture by using storage in each pixel cell to hold the charge integrated from the previous frame period while integrating charge for the current frame period. By summing the signals representing charge integrated during the current and previous frame periods, a signal is produced that has an effective integration time of twice the frame period.

A second method described by Stam et al. uses an interlacing architecture to read a subset of pixel sensors each frame period. Those pixel sensors not read in a given frame period continue to integrate light-induced charge. By reading each pixel sensor at a period that is a multiple of the frame time, an effective integration time greater than the frame time is achieved. Values representing pixel cells not read in a given frame period may be interpolated from neighboring pixel cells that are read.

A third method described by Stam et al. uses a dual integration architecture to provide two integration signals. A first signal is generated by integrating charge over a relatively long period. This charge is stored in the pixel sensor cell. A second signal is generated by integrating charge over a relatively short period. If a signal corresponding to the long integration period is less than a threshold, the long integration signal is used as the output. If the long integration signal is not less than a threshold, the short integration signal is used. This provides an output signal with greater resolution at low light levels while still covering a wide range of brightness.

A fourth method described by Stam et al. uses individual pixel resets to extend the effective dynamic range. In this method, individual or groups of pixel sensors can be reset during the integration time, thereby providing a shorter integration period. Areas of the image of scene 24 that are dimly lit receive longer integration periods than areas that are brightly lit. Using this technique, the bright headlamps of a trailing vehicle in scene 24 are locally sensed at a much lower sensitivity so that saturation in the corresponding portion of the image is reduced or eliminated while still sensing the remainder of scene 24 with sufficient sensitivity. This allows viewing of detail which has heretofore been obscured by bright headlamps. Since there are frequently only two headlamps causing most of the glare in the field of the view of scene 24, and since the image of each headlamp projects a small sized area typically striking at most a two-by-two pixel sensor area, the capability to position as few as two reduced integration time windows of standard size, such as, for example, three-by-three pixel sensors, can yield considerable benefit in control of brightness in the image of scene 24.

The four methods described in Stam et al. can be implemented in the same optical sensor. Control inputs determine which methods are in use, the integration times, and the reset times.

To accommodate wide inter-scene variations in lighting conditions, variable attenuation filter 52 may be used. Input attenuation filter 52 may be implemented with an electrochromic window. The window transitions from substantially clear to maximum attenuation based on attenuation filter signal 72. The steady state attenuation is a reasonably stable and reproducible function of voltage so that, having experimentally determined the relationship between voltage and light attenuation, a controller may be used to set the amount of attenuation. This allows camera system 26 to employ a highly sensitive image sensor array 60 without excessive saturation in bright daylight.

While highly sensitive sensors are desirable because of their sensitivity in low light levels, which approaches the sensitivity of night vision systems, it has been discovered that such sensors are significantly adversely affected by glare from lights on the vehicle that are in close proximity to the camera's optics, particularly at night. Such external lights include tail lights, brake lights, CHMSLs, back-up lights, and turn signal lights. Therefore, it is an aspect of the present invention to provide a mechanism whereby the imaging subsystem may interact with the vehicle lighting system.

The electronic imaging system described above is capable of capturing useful images in very dark conditions, such as those experienced on a moonless night. The light sources in lights 180–182 are preferably arrays of light emitting diodes (LEDs). LEDs have the unique property of very rapid turn-on/turn-off times, unlike incandescent lamps, which require a significant fraction of a second to reach full brightness. Therefore, it is possible to rapidly pulse the LEDs on and off several times a second. The human eye is not capable of detecting flashes at rates greater than about 60 times per second. Consequently, if LEDs are pulsed on and off at a rate of 60 Hz or greater, the human eye will perceive the LEDs as being on continuously. The same averaging effect of the human eye allows discrete frame motion video to appear as continuous motion. A frame rate of 30 frames per second allows video, which is generally accepted as continuous at a frame rate of 60 frames per second, to have superb quality. Interlacing at 60 fields per second (of 30 full frames per second) is standard in NTSC television broadcasts.

Figure 3:
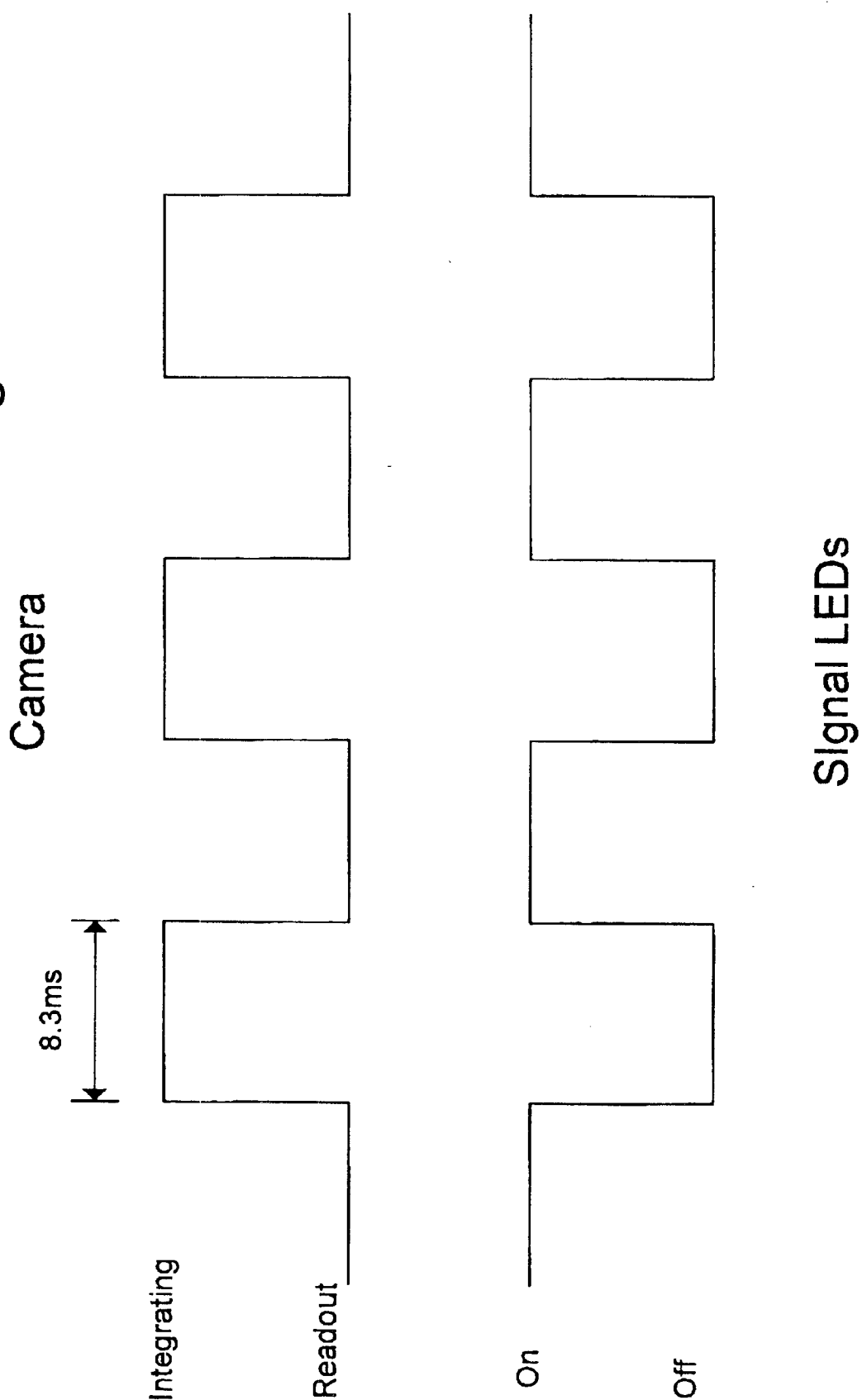
FIG. 3 is a timing diagram illustrating the relation between the reading of images from a sensor array and the on/off state of a proximate light source.

Using these two concepts, it is now possible to construct an integrated assembly 200 including at least one light 180–182 and a camera 26a, where the camera does not experience feedback glare from integrated lights. This is done by alternatively capturing frames with the imaging system and pulsing the LEDs of the integrated lights on and off. The LEDs are pulsed between frame integration periods. For example, if 60 frames per second video is desired, camera 26a can acquire with the LEDs off for 8.3 msec. This is followed by an 8.3 msec period, where camera 26a is not acquiring and the LEDs are turned on. Such a system may be implemented by driving switches 151 and 152 such that the on-phase of the illuminators 180 and 182 are synchronized with the integration period of the image sensor array 60 as indicated in FIG. 3.

The ability of camera 26a to capture useful images at low light levels depends directly on the integration time of image sensor array 60. The longer the image sensor is able to integrate light, the better able the camera is to produce images with resolvable detail in reduced light conditions. While the 8.3 msec frame period mentioned above should be suitable for daylight image capture, it is probable that a longer integration period will be required at night. As stated, the 8.3 msec frame period refers to both the integration and readout time periods. The readout time is typically limited by the rate of A/D conversion in a digital camera system or the scan rate in an analog system. This means the actual integration time could be much less than 8.3 msec. However, the CMOS photogate active pixel architecture used in the imaging subsystem described above, allows the entire 8.3 msec to be used for integration and the readout to occur during the period when the LEDs are on. This is accomplished by integrating for 8.3 msec and then transferring the charge from the photosite into each pixels' floating diffusion. The charge transfer can occur simultaneously for all pixels or rapidly row by row. Finally, during the next 8.3 msec period, the signal is read out of the floating diffusion.

If additional integration time is needed, the frame adding technique described in detail in the above-cited U.S. Pat. No. 6,008,486, can be used to combine two 8.3 msec integration periods into one frame. This is done by storing the charge from one frame in the floating diffusion while the next frame is being acquired. The charge from both frames is added together to give a greater signal. Finally, the pulse frequency of the LED/camera cycle can be reduced to give greater integration times. However, this comes at the disadvantage of increased flicker of the integrated light with decreased pulse frequency.

The determination of the required integration times and duty cycles can be made by image processing unit 30, which evaluates the average brightness of each image. The image processing unit provides the signal to turn the LEDs on and off and initiates the image acquisition process. Image processing unit 30 is described below and is described more completely in the above-cited U.S. patent application Ser. No. 09/001,855, which also contains a circuit to provide rapid evaluation of the brightness of an image.

In addition to signal lights, binary complementary white LED illumination may be provided to further assist the driver in backing up or as cargo lighting in a pick-up truck. In this case, it is assumed that this light is not needed by the image subsystem for satisfactory imaging, but instead is intended to provide illumination to assist the driver. As described further below, such driver assistance illuminators are particularly advantageous when the vehicle is equipped with privacy glass. To avoid glare from this light, the binary complementary white LEDs can be pulsed on and off in the same fashion as the signal LEDs.

Although the above description describes the use of a CMOS photogate active pixel sensor for image sensor array 60, other imaging technologies can be used. For example, a frame transfer CCD (charge coupled device) would allow the integration of light during a period where the LEDs are off and the readout while the LEDs are on. Other CMOS imaging technologies including photodiode active pixel sensors, passive pixel sensors, and PIN photodiode pixel sensors could also be used. CIDs (charge injection devices), BCMDs (bulk charge modulated devices), and any other imaging technology may be used with various degrees of performance.

A second method of eliminating the glare from the integrated signal lights involves filtering out the light emitted from those lights. This method is appropriate for any type of electronic imaging technology. LEDs typically have a relatively narrow spectral band in which they emit the majority of their light energy. The light emitted from an LED is distributed in an approximately normal distribution with a standard deviation of approximately about 10 nm. As a result, a relatively narrow band notch interference filter can prevent the majority of light from an LED from entering the camera's optical system, while not significantly reducing the total light reaching the camera across the spectrum in the region where the camera is sensitive.

In the preferred embodiment, a narrow band reflecting interference filter 385 (FIG. 9) is placed in the optical path of camera 26a. The filter is designed to have maximum reflection at the peak emission wavelength of the LEDs used in the integrated signal lights. The filter is also designed to transmit light of wavelengths shorter and longer than those that are substantially emitted by the LED. Therefore, the camera is effectively blind to the specific wavelengths of light emitted by the LED while being able to image the majority of the spectrum. The filter can be placed in front of the lens, integral with the lens, or behind the lens in front of the image sensor.

The final embodiment to prevent light from the integrated signal lights from interfering with the electronic imaging subsystem is to provide a baffling means to block light from outside the camera's desired field of a view from entering the imaging system. This can be accomplished by placing a black shroud or baffling means around the lens extending beyond the integrated lights in the manner described in more detail below with reference to FIGS. 8 and 9.

For some imaging systems, it may be necessary to provide supplementary illumination during dark conditions to achieve satisfactory imaging. This is particularly true when the camera is positioned behind privacy glass. In this case, a variety of LED illuminators can be used to provide such illumination. IR LEDs have the advantage of providing light which is detectable by silicon imaging technologies while not being visible to the human eye. Therefore, if IR supplementary illumination is used, IR emitter 140 can be on whenever camera 26a is operating without becoming distracting to other drivers. LEDs of between 780 and 800 nm peak wavelength are preferred, since they are not visible to humans but are near enough to the visible spectrum to not be severely aberrated by an optical system designed for visible wavelengths. Various visible illuminators can also be used, including binary complementary white light illumination.

The alternating pulse system described above provides a mechanism for achieving a greater output from an illumination LED. It is well known that LEDs can be operated at substantially higher powers if pulsed than if operated continuously. Since the image system is only integrating during pulsed cycles, it is advantageous to only operate the supplementary illumination LEDs when the camera is integrating. This pulsed operation allows higher currents to be used in higher output levels from the LEDs thereby reducing the number of LEDs needed in the application.

The disadvantage of providing supplemental illumination for the rear vision system incorporated in the same assemblies as the camera assembly is the potential glare back into the camera lens as described for integrated signal lights. This is overcome using a baffling means similar to that shown in FIGS. 8 and 9 to baffle light from the integrated signal lights. Alternatively, the supplementary illumination could be provided in a separate location from the integrated signal light/camera assembly. Another possibility would place the lights and supplementary illuminator in one package and the camera in a different location. In any case, the three devices are preferably controlled from a central source, such as image processor unit 30, which coordinates the timing of the signal lights, driver assistance illuminators, supplementary imaging system illuminator, and camera.

Image processor unit 30 includes an image brightness detector 74 and a display pixel luminance mapping control 76, both of which receive the camera system output 68. Image brightness detector 74 may determine the brightness level of the entire image and may determine brightness levels of regions within the image. Display pixel luminance mapping control 76 may compress the wide dynamic range of camera system output 68 to one which is comfortably viewable by operator 22. Display pixel luminance mapping control 76 may also increase the visibility of scene 24 while limiting higher light levels, which are detrimental to the night vision of operator 22. Display luminance signal 78 is processed by display interface 80 to produce display signal 82 for display device 32a. Control logic 84 is in communication with image brightness detector 74 through bus 86, display pixel luminance mapping control 76 through bus 88, display interface 80 through bus 90, image sensor interface and control 62 using image sensor control signal 92, input attenuation control 70 using input attenuation control signal 94, and other elements as are described in above-cited U.S. patent application Ser. No. 09/001,855.

Display device 32 includes a display interface 80 that feeds a display signal 82 to display 100. Display rays 104 generated by display 100, pass through optional display variable attenuation filter 106 and emerge as filtered display rays 108. Filtered display rays 108 representing scene 24 are viewed by operator 22. If optional display attenuation filter 106 is used, the amount of attenuation is controlled by display attenuation control 110 through display attenuation filter signal 112.

Display 100 may be implemented with a number of different technologies, including cathode ray tubes (CRT), field emission displays, back lit liquid crystal displays (LCD), and heads-up display (HUD). Many displays do not have the brightness range necessary to cover a good dynamic range within one frame in addition to a very large total brightness range for use in ambient light conditions, which range from darkness to bright sunlight. To reduce requirements on display 100, a display variable attenuation filter 106 may be used. In the preferred embodiment, attenuation filter 106 is implemented with an electrochromic window. The attenuation filter is controlled by image processor system 30 through display attenuation control signal 114. A method for controlling filter 106 is described in more detail in the above-cited U.S. patent application Ser. No. 09/001,855.

Physical Implementations

Figure 4:
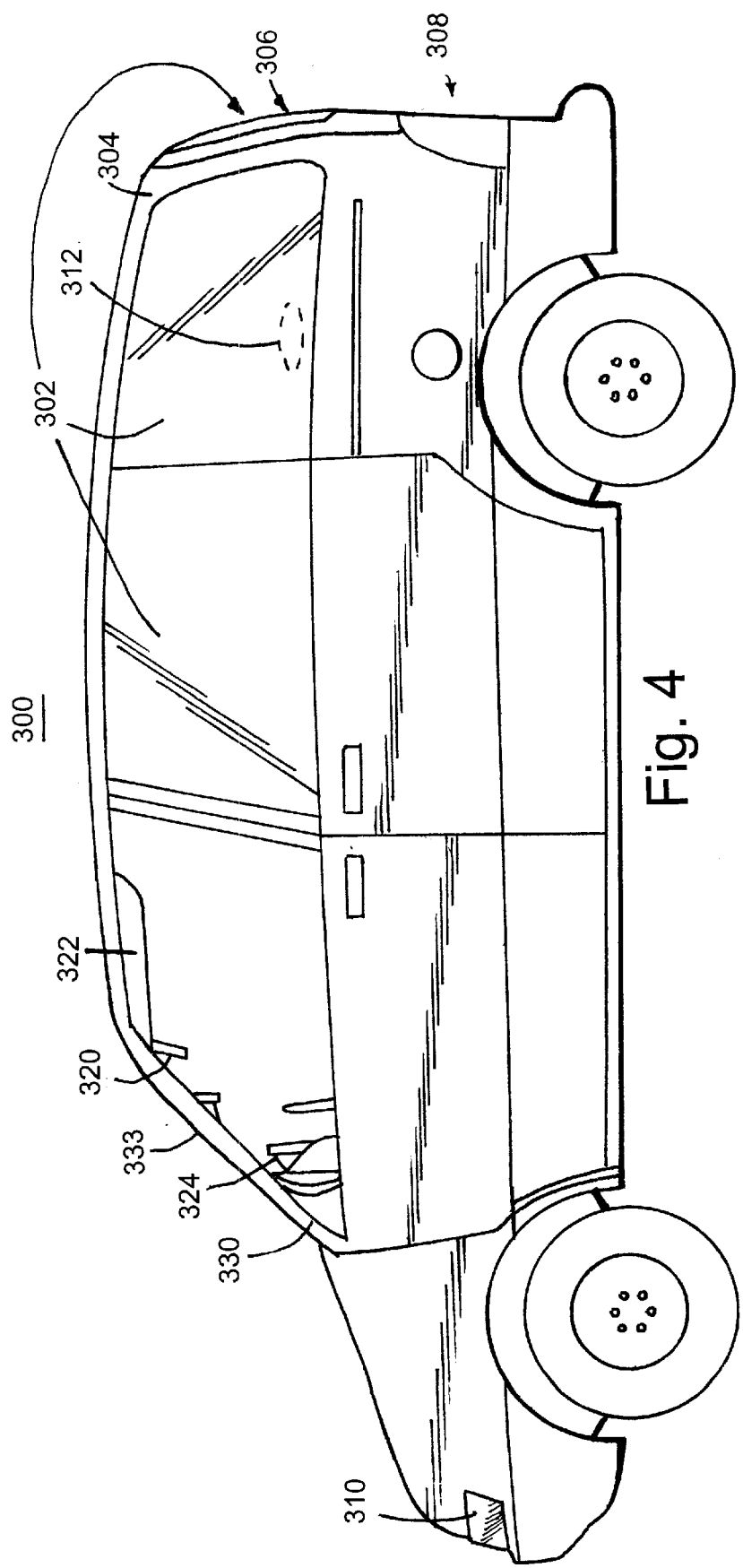
FIG. 4 is a side perspective view of a vehicle in which the present invention is implemented.

Having generally described the present invention on a system level, the physical implementation of the system and various components will now be described. FIG. 4 shows a side view of a vehicle 300 having side and rear windows 302 that may be made of privacy glass. If assembly 200 (FIG. 1) is constructed as a CHMSL, assembly 200 may be mounted in any central location on the rear of vehicle where CHMSLs are commonly mounted. For example, assembly 200 may be mounted in a central location 304 on the roof of a vehicle above the rear window. Alternatively, assembly 200 may be mounted behind the rear window as indicated by reference 306. For vehicles having a trunk, assembly 200 may be mounted to the trunk lid (not shown).

If the light integrated in assembly 200 with camera 26a is not a CHMSL but is a turn signal light, running light, back-up light, or brake light, assembly 200 may be mounted in one or both tail light assemblies 306. Additional cameras 26b and 26c may be mounted in assemblies 200 that are located within the front head light/turn signal light assemblies 310. Such additional cameras may be mounted to capture images forward of the vehicle, perpendicular to the direction of travel of the vehicle to improve vision at blind intersections, or to the side and rear of the vehicle. Additional side cameras 26b and 26c may also be mounted behind the vehicle's side windows in location 312, for example.

As will be explained in further detail below with reference to FIGS. 15–20, one or more display devices 32 may be mounted in various locations within the view of the vehicle operator. For example, a display device 32 may be mounted in an overhead console 322 of the vehicle and/or may be mounted to support 324 on an instrument panel 320. Alternatively or additionally, display device 32 may be provided in interior rearview mirror 333 or in one or both of the exterior rearview mirrors 330.

Figure 5:
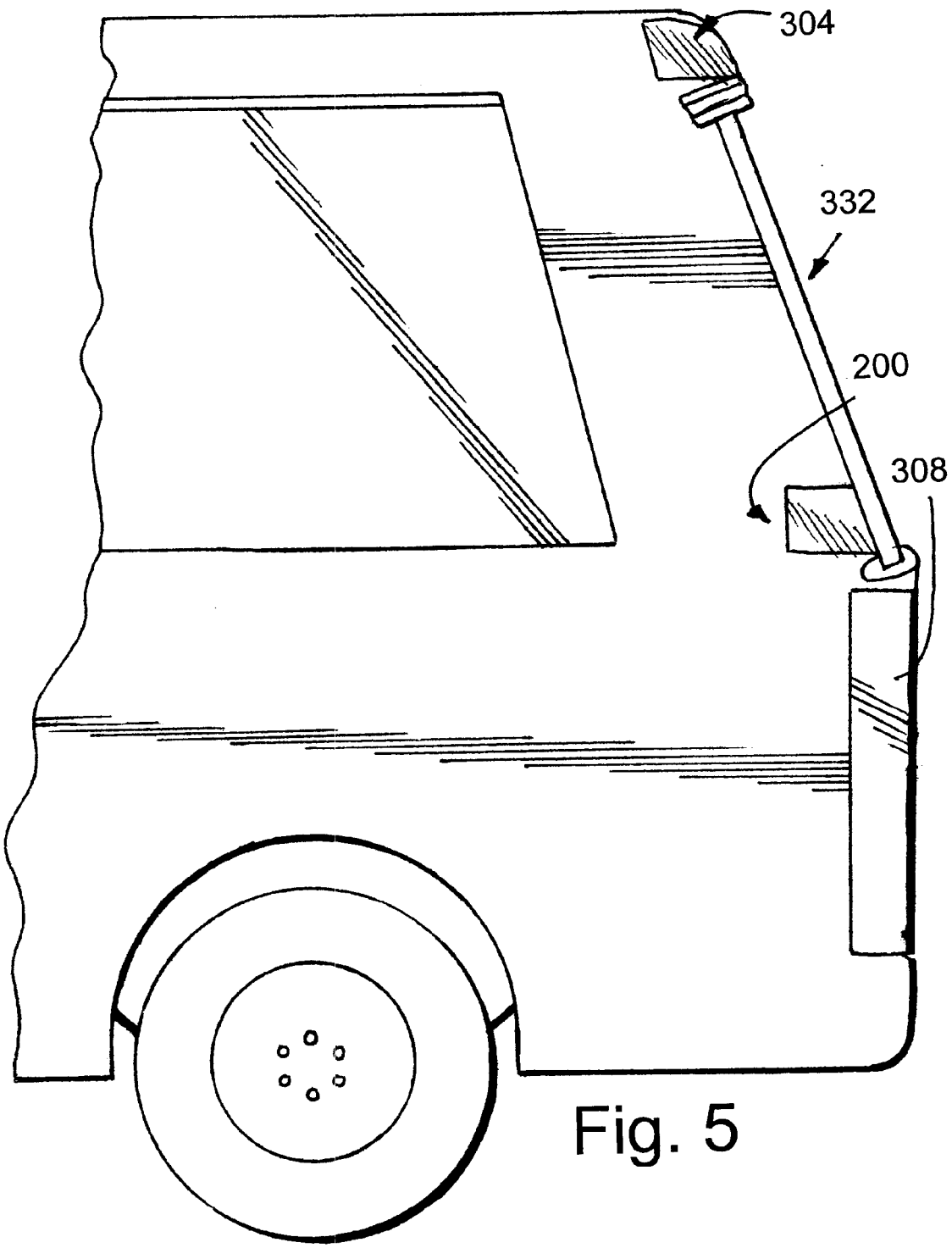
FIG. 5 is a partial side perspective view of the vehicle shown in FIG. 4 taken in partial cross section.

FIG. 5 shows an enlarged partial section of vehicle 300 of FIG. 4 in which assembly 200 is mounted to the interior surface of rear window 332. As shown in FIG. 6, rear window 332 may include an integral defroster 334 that defines a defroster zone of rear window 332. Window 332 may also have a windshield wiper 336 mounted thereto or in proximity thereto for wiping dirt, snow, or other debris from a wiper zone 338 on the outer surface of rear window 332. Also, a washer fluid nozzle 340 may be mounted to windshield wiper 336 or to the body of vehicle 300 in proximity to rear window 332 so as to dispense washer fluid in a washer zone on the outer surface of rear window 332.

As shown in FIG. 7, assembly 200 is mounted in a central location in the lower portion of rear window 332. Preferably, assembly 200 is mounted behind at least one of the washer zone, wiper zone 338, or defroster zone, such that a camera 26a mounted in assembly 200 will have as clear a view as possible through rear window 332. If rear window 332 includes a frit 350, which is a black or opaque coating or film forming a band around the periphery of rear window 332, assembly 200 may be covertly mounted behind a masked-out portion 352 in frit 350. The masked-out portion 352 is a substantially transparent region of window 332 bounded by frit 350. The portion of the rear window 332 that corresponds to masked-out portion 352, may be completely clear or tinted regardless of whether the rest of window 332 is clear or tinted.

Figure 8:
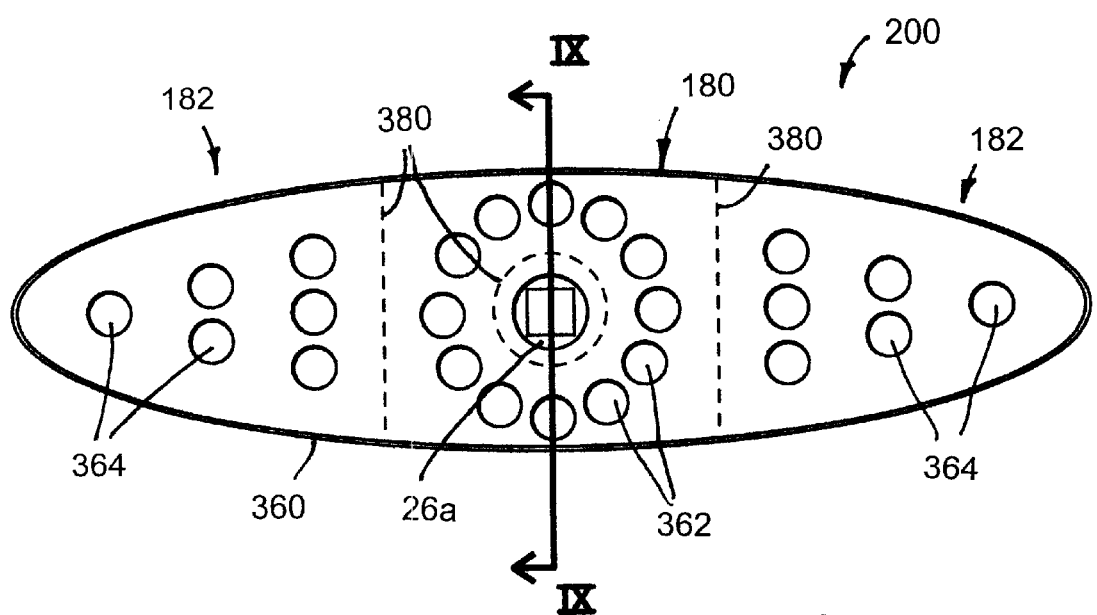
FIG. 8 is a front perspective view of a light/camera assembly constructed in accordance with a first embodiment of the present invention.
Figure 9:
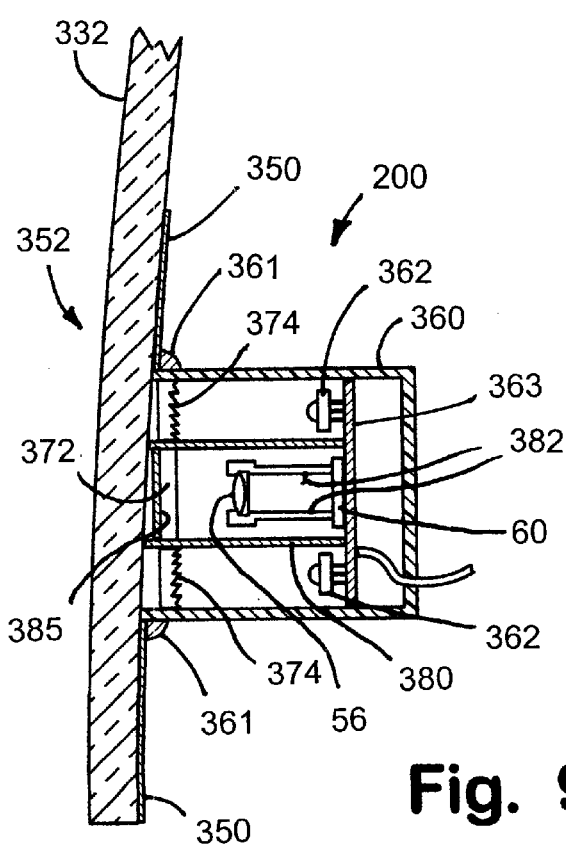
FIG. 9 is a side cross-sectional view of the light/camera assembly shown in FIG. 8 as applied to a vehicle window.

FIGS. 8 and 9 show an exemplary construction of an assembly 200 that may be mounted to the inside surface of rear window 332. Assembly 200 includes a support structure 360 that together with a lens 370 constitutes a housing. To improve the aesthetic appearance of assembly 200 as seen through rear window 332, at least the inner surfaces of support structure 360 are painted black or some other dark color. As shown in FIG. 9, support structure 360 may be mounted within a masked-out region 352 in frit 350 using a dark colored adhesive and/or caulk 361 to prevent light from exiting through any gaps formed between support structure 360 and the interior surface of rear window 332.

As shown in FIG. 8, first light 180 includes a central array of first LEDs 362, and second light 182 includes two arrays of second LEDs 364 each positioned on opposite sides of first light 180. Camera 26a is mounted in the center of the array of first LEDs 362 forming first light 180. To prevent stray light from lights 180 and 182 from causing feedback glare through the camera optics, baffles 380 are provided between the first and second arrays of LEDs 362 and 364 and between camera 26a and first array of LEDs 362. Baffles 380 are preferably formed of an opaque material and extend through and outward from lens 370.

Referring back to FIG. 9, LEDs 362 (as well as LEDs 364) are mounted to a printed circuit board 363 that is mounted within support structure 360. Camera 26a is also preferably mounted to circuit board 363. Specifically, image sensor array 60 is mounted on circuit board 363 with the camera lens system 56 supported a distance away from board 363 by lens supports 382. With this construction, baffles 380 should extend to circuit board 363.

Lens 370 is preferably formed with four separate zones corresponding to the two arrays of LEDs 364 of second light 182, the array of LEDs 362 of first light 180, and camera 26a. Lens zone 372 overlies camera 26a and is generally a flat transparent structure so as to not distort the image captured by camera 26a. Lens zone 374 overlies the array of LEDs 362 of first light 180 and preferably has a roughened surface to diffuse the light emitted from LEDs 362. For example, lens zone 374 could be configured as a corner cube diffuser. The lens zone overlying the two arrays of LEDs 364 of second light 182 may be configured as a Fresnel lens or in any other manner so as to project illumination as fully as possible within the field view of camera 26a. For reasons stated above, a bandpass notch filter 385 may be applied as a coating or film to a surface of lens 370 in lens zone 372 so as to filter out light having wavelengths similar to that emitted from LEDs 362 and/or LEDs 364.

By making all the components black with the exception of the lens, camera lens, and LEDs, assembly 200 may be covertly hidden behind rear window 332. Preferably, the portion of rear window 332 corresponding to masked-out portion 352 of frit 350 is tinted privacy glass to further hide assembly 200. In this manner, no one would be able to notice the presence of the camera and would only notice the presence of the assembly when one of the lights is illuminated. This offers a safety advantage that it is much less likely that bright sunlight could cause the brake lights or CHMSL to erroneously appear as though it were on. In addition, camera 26a could be used for security purposes as well as rear vision.

The assembly may further be made more covert by employing a metallic or interferential bandpass filter to rear window 332 or by mounting an active element such as an electrochromic element to the window that can be made transparent when the camera or lights are activated and may be darkened at all other times. For example, the electrochromic element could be maintained in a normally darkened state, and could be controlled to clear in response to the application of the vehicle's brakes and to return to the normally darkened state when the brakes are no longer applied. Because the electrochromic element does not clear instantaneously, the LEDs constituting the brake light may be controlled to initially emit light at a greater intensity to compensate for the lack of immediate clarity of the electrochromic element. Once the electrochromic element has fully cleared, which only takes less than a half of a second, the intensity of the LEDs may be correspondingly reduced. Examples of electrochromic elements that can be used for this purpose are disclosed in U.S. Pat. No. 4,902,108 and in U.S. patent application Ser. No. 08/832,596, entitled AN IMPROVED ELECTROCHROMIC MEDIUM CAPABLE OF PRODUCING A PRE-SELECTED COLOR, by Kelvin Baumann et al., the disclosures of which are incorporated herein by reference.

With assembly 200 mounted in the location shown in FIG. 7, first light 180 preferably functions a CHMSL, and thus, LEDs 362 are preferably red or red-orange and are activated when vehicle light system control 162 issues a brake signal. As described above, the brake signal applied to LEDs 362 may be pulsed by application of a signal to a corresponding switch 151 (FIG. 1) by image processing unit 30. Second light 182 may function as any form of signal or illumination light. Preferably, second light 182 functions as IR emitter 140 to provide supplemental illumination for camera 26a in which case LEDs 164 are LEDs that emit IR radiation in the 780 to 800 nm range. As stated above, any IR radiation emitted may be continuous since it would not impair the vision of any other drivers. Alternatively, IR LEDs may be pulsed on during those periods in which camera 26a is integrating in order to maximize the intensity of their emissions.

Second light 182 could also function as a rearward driver assistance illuminator whereby it would project substantially white light rearward to assist the driver while backing up the vehicle. In this case, LEDs 362 may be white light emitting LEDs or may include LEDs that emit light of binary complementary or ternary complementary colors. Binary complementary LEDs that, in combination, project metameric white light are disclosed in the above-cited U.S. Pat. No. 5,803,579. When such white light illumination is to be projected from second light 182, the activation signal used to turn on the back-up lights would also be used to activate LEDs 362 when the vehicle is in reverse. Again, to maximize the illumination from second light 182, LEDs 362 may be pulsed on while camera 26a is integrating. However, to minimize the glare from LEDs 362 from adversely impacting the image captured by camera 26a, LEDs 362 are preferably spaced apart from camera 26a and baffles 380 are provided to block as much glare as possible. It will be appreciated, however, that assembly 200 may be constructed without camera 26a, in which case, LEDs 362 may, but need not, be pulsed.

By having assembly 200 directly mounted to rear window 332 in the manner described above, a rear window modular structure 301 may be created that may be shipped as a single OEM product to an assembly plant. By integrating the camera and the CHMSL in a single assembly and incorporating that assembly into a module structure including a rear window and any defroster and/or wiper, wiring for the electrical components may extend from a single location on rear window module 301 thereby simplifying the installation of these components at the assembly plant. Moreover, the inclusion of the camera in such a rear window modular structure enables a rear window manufacturer to offer an added value to the vehicle manufacturer.

Figure 10:
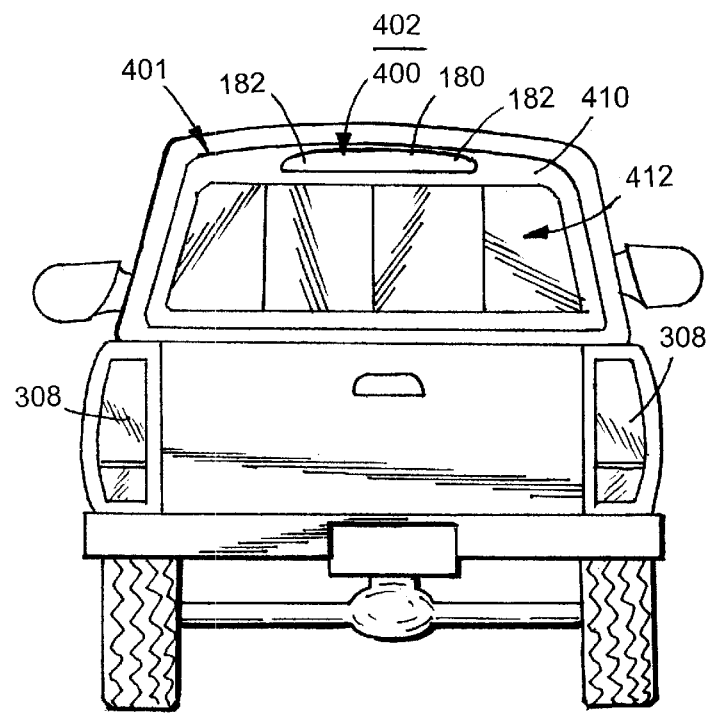
FIG. 10 is a rear perspective view of a vehicle in which a second embodiment of the present invention is implemented.

FIG. 10 shows an alternative mounting of a light assembly 400 constructed in accordance with the present invention. As shown, assembly 400 is mounted within the frame structure 410 surrounding and supporting a rear window 412. Assembly 400, rear window 412, and frame 410 may be preassembled into a single modular structure 401 that may be supplied as an OEM product and installed at an assembly plant. Modular structure 401 differs from modular structure 301 (FIG. 6) in that assembly 400 is not mounted behind rear window 412, but rather is mounted adjacent rear window 412 such that light emitted therefrom is not projected through window 412, which may be made of privacy glass. Modular structure 401 also offers the advantage that a camera mounted in assembly 400 will not have its effective sensitivity reduced by privacy glass. As explained further below, assembly 400 may, but need not, include a camera.

Figure 11:
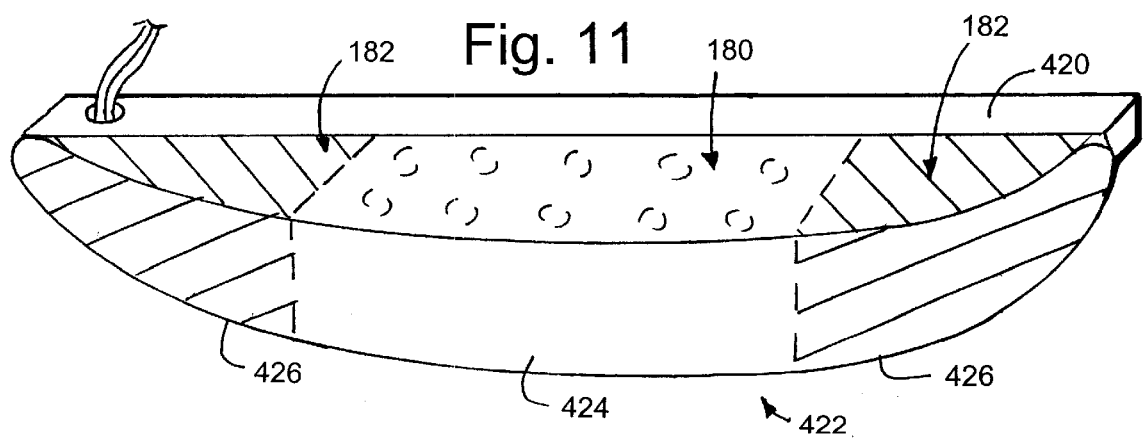
FIG. 11 is a perspective view of a center high mounted stoplight (CHMSL) assembly constructed in accordance with the second embodiment of the present invention.

As shown in FIGS. 11 and 12, assembly 400 includes a support structure 420 and a lens structure 422 that together form a housing for a first light 180 and second light 182. Preferably, first light 180 includes an array of red or red-orange LEDs 428 that are activated in response to an activation signal received when the vehicle brakes are applied so as to function as a CHMSL. Second light 182 preferably includes two arrays of LEDs 430 provided on opposite sides of the array of LEDs 428. LEDs 430 preferably include LEDs that are capable of causing white light to be emitted from lens 422. More preferably, LEDs 430 include binary complementary LEDs as disclosed in the above-cited U.S. Pat. No. 5,803,579. LEDs 430 may thus function as a cargo light for a pick-up truck 402 (FIG. 10), as signal lights, and/or as driver assistance illumination lights. As can be readily perceived, such driver assistance illumination lights are particularly useful when used in a vehicle such as a minivan, sport utility vehicle, or pick-up truck with privacy glass that inherently limits rearward visibility.

Lens 422 preferably includes three regions overlying each of the three arrays of LEDs. Central region 424, which overlies LEDs 428, may be clear or red and function as a diffusion lens. Peripheral regions 426, which overlie the two arrays of LEDs 430, are preferably clear with integrated optics suitable for functioning as a cargo light or as a signal light. An example of optics that may be used to direct the light is disclosed in U.S. patent application Ser. No. 09/109,527, entitled OPTICAL ASSEMBLY FOR SEMICONDUCTOR LIGHTING DEVICE ILLUMINATOR, the disclosure of which is incorporated herein by reference.

As mentioned above, a camera/light assembly may be mounted in the tail light assembly 308 of a vehicle. FIGS. 13 and 14 show the possible construction of such an assembly 500. Assembly 500 preferably includes a support structure 502 and a lens 504 that together provide a housing for the integrated lights and camera system. A first light 180 is provided in an upper portion of assembly 500 that includes an array of red or red-orange LEDs 506 mounted to a circuit board 363. First light 180 is preferably controlled in such a manner so as to function as the brake lights, turn signal lights, and running lights of the vehicle. Second light 182 preferably includes an array of LEDs 508 mounted to circuit board 363 adjacent the array of LEDs 506. LEDs 508 are preferably capable of projecting white light from lens 504. More preferably, LEDs 508 are binary complementary LEDs. By projecting white light, second light 182 may function as a back-up light.

A camera 26a is also mounted to circuit board 363. As discussed above, camera 26a includes image sensor array 60 and a lens system 56 supported by lens supports 382. Lens 504 preferably includes three regions including a first region 510 overlying the LEDs of first light 180, a second region 512 overlying the LEDs of second light 182, and a third region 514 overlying camera 26a. First region 510 is preferably either red or clear and acts as a diffuser. Second and third regions 512 and 514 are preferably clear. Third region 514 does not introduce optical effects while second region 512 preferably serves to direct the emitted light in a particular direction. To prevent stray light from lights 180 and 182 from interfering with the imaging by camera 26a, baffles 380 are preferably provided between the two arrays of LEDs 506 and 508 and between the array of LEDs 508 and camera 26a.

LEDs 508 may additionally include LEDs for emitting IR radiation. As described above, such IR radiation enhances the ability of camera 26a to capture images at night.

If cameras are mounted in both tail light assemblies 308, a stereoscopic image may be obtained and synthesized according to the teachings of International Application No. PCT/US96/07382, the disclosure of which is incorporated herein by reference. If additional cameras 26b and 26c are also mounted in the front headlamp/turn signal assemblies 310 (FIG. 6), in the front side fenders of the vehicle (as indicated by reference numeral 309 in FIG. 6), or in exterior rearview mirror assemblies 330, the two side images may be synthesized with the image captured by rear camera(s) 26a into a single display image as taught in International Application No. PCT/US96/07382. Alternatively, each captured image may be displayed on a separate display device 32a–32c. Some options for mounting display devices 32 are described below with reference to FIGS. 15–20.

Figure 15:
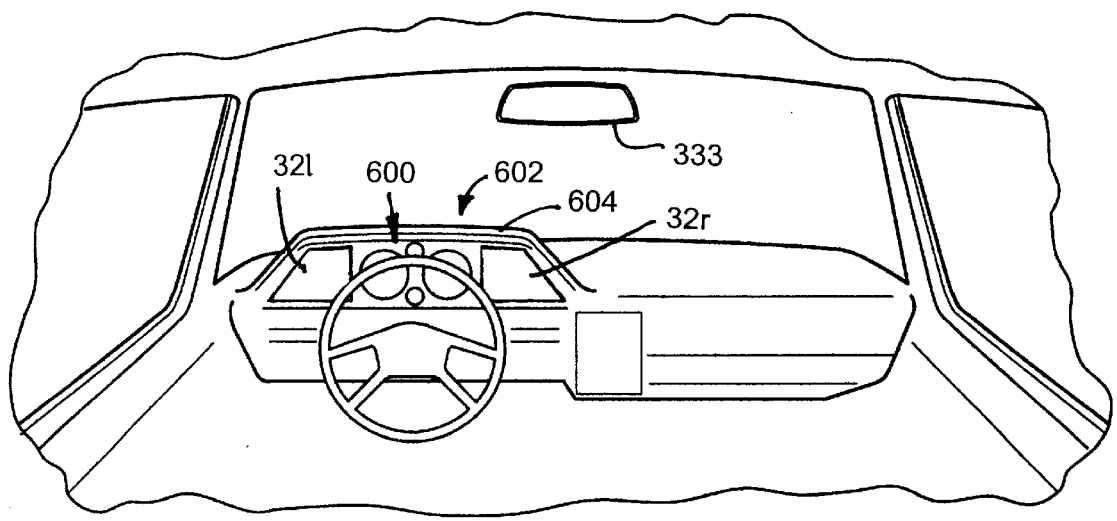
FIG. 15 is a perspective view of the front interior of a vehicle in which the present invention is implemented according to an alternative embodiment.
Figure 16:
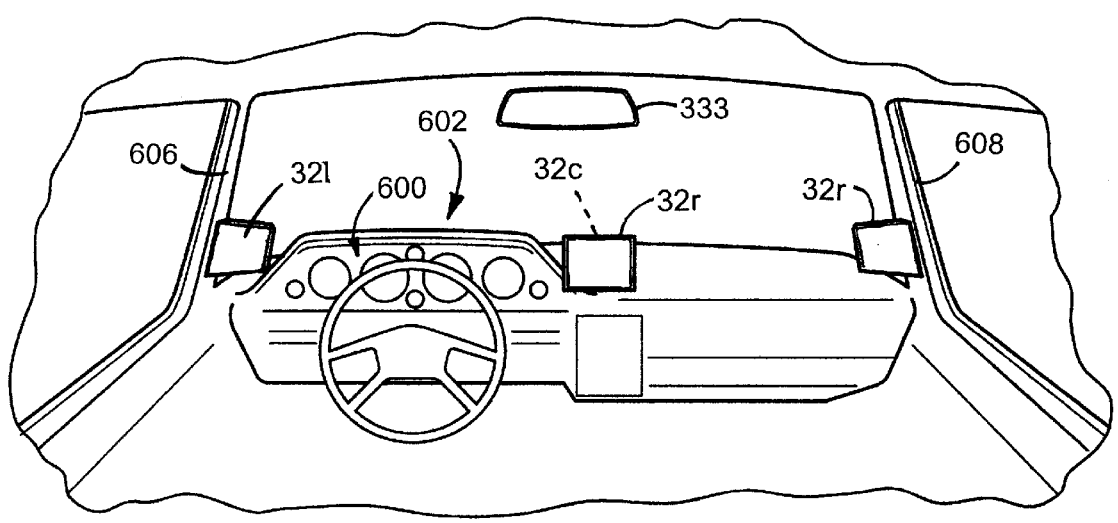
FIG. 16 is a perspective view of the front interior of a vehicle in which the present invention is implemented according to an alternative embodiment.

FIGS. 15 and 16 illustrate two possible implementations for providing two displays within the view of the driver. Two displays would be used when two corresponding cameras are used that are both mounted to the rear of the vehicle or on opposite sides of the vehicle. In FIG. 15, a left display 32l and a right display 32r are incorporated in the instrument panel 602 on opposite sides of the conventional gauges 600 (e.g., speedometer, tachometer, fuel gauge, etc.) normally provided in a vehicle instrument panel. In this manner, the cowling 604 that extends over and around gauges 600 will prevent glare by blocking direct sunlight from impinging upon the surfaces of displays 32.

FIG. 16 shows two alternative arrangements for implementing two displays in a vehicle. In both arrangements, left display 32l is mounted on the driver's side A-pillar 606. In one arrangement, the right display 32r is mounted on instrument panel 602 on the right side of display gauges 600. In the other arrangement, right display 32r is mounted to the passenger's side A-pillar 608. By mounting left and right displays to the respective A-pillars, the driver may look in the same general direction as the driver would normally look to view the left and right rear images through conventional exterior review mirrors. Thus, the second arrangement shown in FIG. 16 offers the advantage that would be more likely to receive consumer acceptance, since it does not require any significant change in driving habits.

Figure 17:
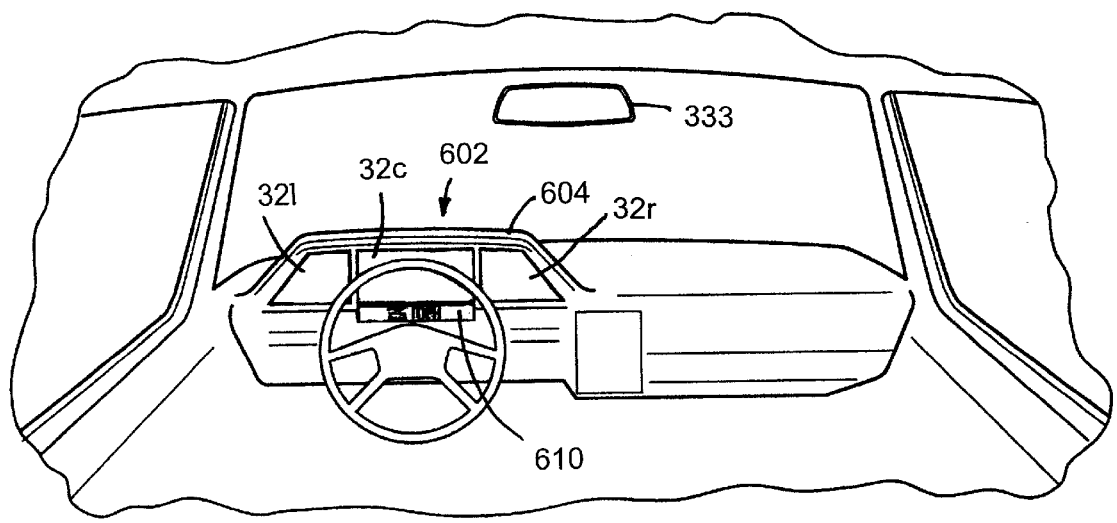
FIG. 17 is a perspective view of the front interior of a vehicle in which the present invention is implemented according to an alternative embodiment.

The arrangements shown in FIG. 16 may also be combined so as to provide three displays 32 with left and right displays 32l and 32r mounted to the respective left and right A-pillars 606 and 608, and a central display 32c mounted on instrument panel 602 in a central location. Such a three-display configuration is particularly advantageous when images are obtained from cameras mounted to the two sides of the vehicle as well as from a camera mounted to the rear of the vehicle. FIG. 17 shows an alternative arrangement for a three-display configuration whereby the left, center, and right displays are all mounted on instrument panel 602 in the region where the gauges are normally provided. In this case, the gauges may be replaced with a digital alphanumeric display 610 that may extend along the instrument panel in a position below the right, center, and left displays.

Figure 18:
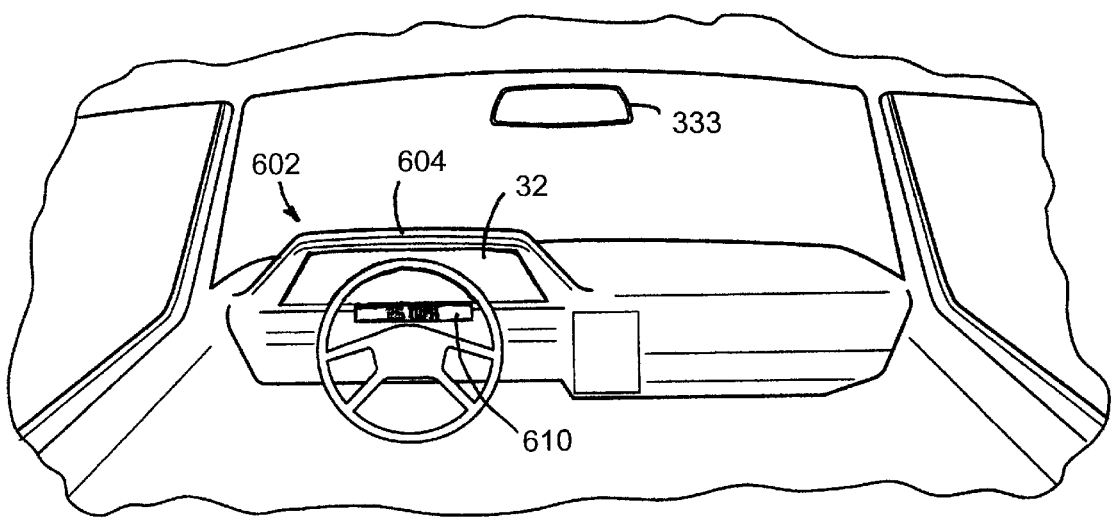
FIG. 18 is a perspective view of the front interior of a vehicle in which the present invention is implemented according to an alternative embodiment.

FIG. 18 shows an implementation that is similar in effect to that shown in FIG. 17, only instead of including three separate displays, a single display 32 is provided in instrument panel 602 to display a synthesized image obtained by combining the images from more than one camera. Like the arrangement shown in FIG. 17, a digital alphanumeric display 610 is provided that extends along the instrument panel in a position below display 32.

Figure 19:
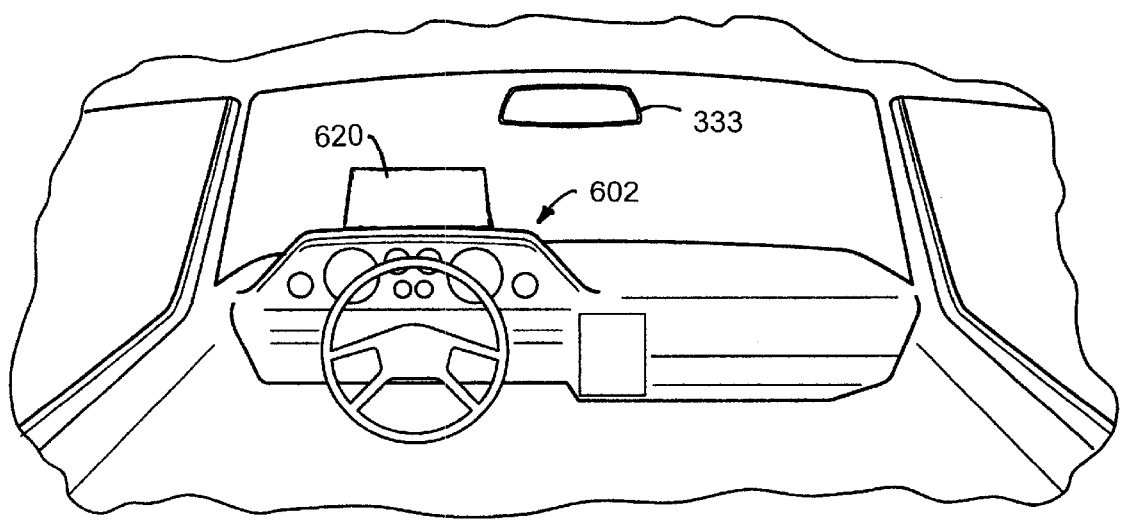
FIG. 19 is a perspective view of the front interior of a vehicle in which the present invention is implemented according to an alternative embodiment.

Alternatively, as shown in FIG. 19, a heads-up or virtual display device 620 may be mounted above or within instrument panel 602 to project an image obtained from a single camera or a synthesized image obtained from multiple cameras.

Figure 20:
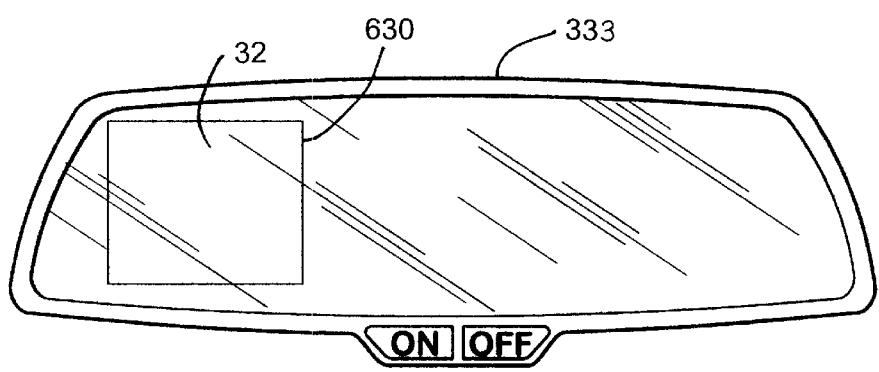
FIG. 20 is a perspective view of an interior rearview mirror constructed in accordance with the present invention.

FIG. 20 shows an interior rearview mirror assembly 333 having a display window 630 through which a mini in-mirror display 32 may be mounted. Such an arrangement is particularly advantageous when combined with the arrangement shown in FIG. 16 whereby the right and left camera images are displayed on respective right and left displays mounted to the right and left A-pillars and the image from a rear mounted camera is fed to display 32 in rearview mirror assembly 333. In this manner, all the images from three separate cameras may be discretely displayed in locations where a driver is accustomed to seeing similar images as would be viewed through the internal and external rearview mirrors.

Figure 21:
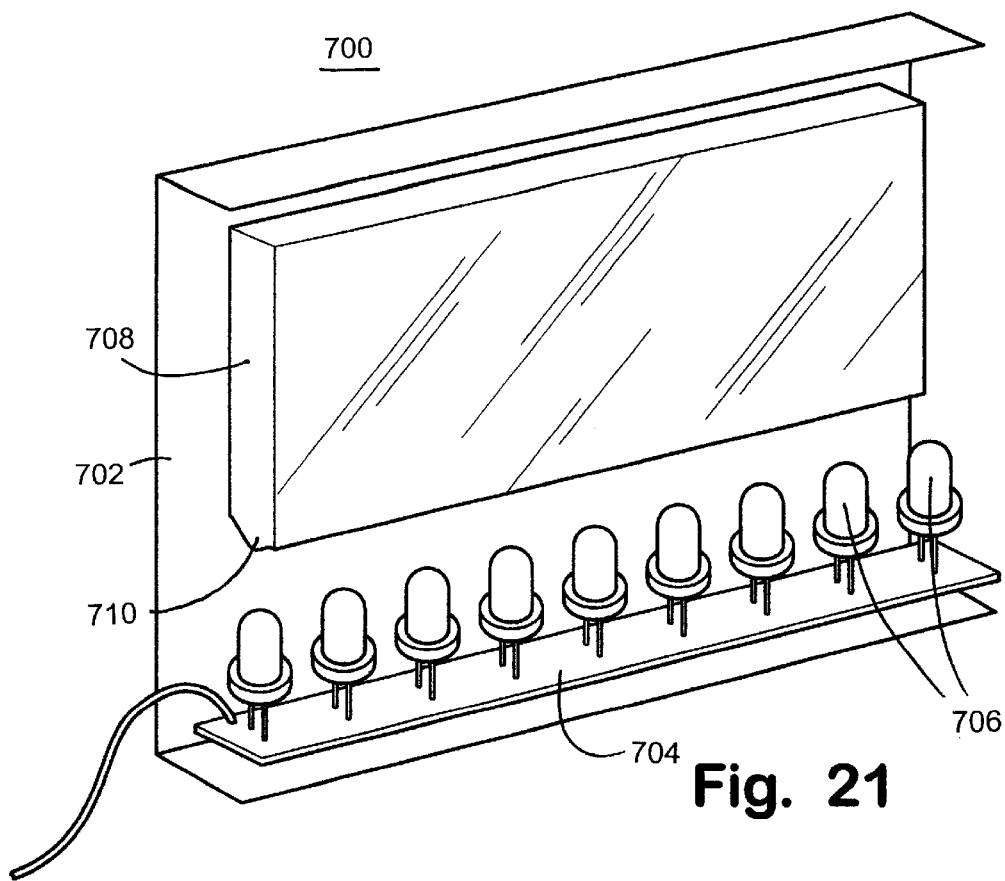
FIG. 21 is an oblique perspective view of a CHMSL light source constructed in accordance with the present invention.
Figure 22:
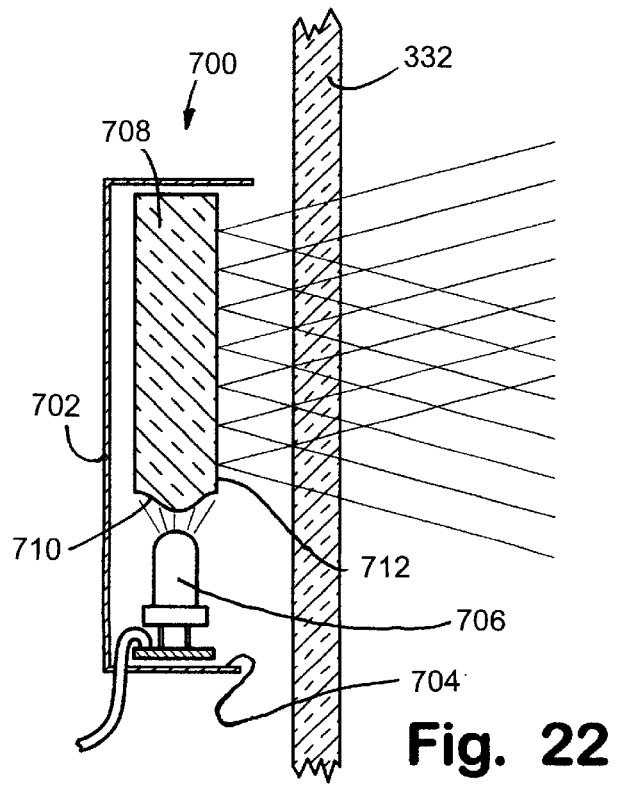
FIG. 22 is a side perspective view of the CHMSL light source shown in FIG. 21.

According to another aspect of the present invention, a CHMSL 700 may be constructed as shown in FIG. 21. CHMSL 700 includes a support structure 702 to which a circuit board 704 is mounted. Circuit board 704 has mounted thereon a linear array of red or red-orange LEDs 706. Also mounted on support structure 702 is a diffuser/collimator 708. Diffuser/collimator 708 is preferably a light-directing film, light-directing array, or equivalent as commercially available from Allied Signal, Inc. of Moorestown, N.J. Diffuser/collimator 708 has a shape of a generally flat rectangle. Circuit board 704 and diffuser/collimator 708 are mounted on support structure 702, such that the light emitted from LEDs 706 is projected into a lower convex toric edge surface 710 of diffuser/collimator 708. As shown in FIG. 22, the light projected into edge 710 from the plurality of LEDs 706 is mixed, diffused, and collimated into beams projected from the flat rear facing surface 712 of diffuser/collimator 708 outward through rear window 332.

Figure 23:
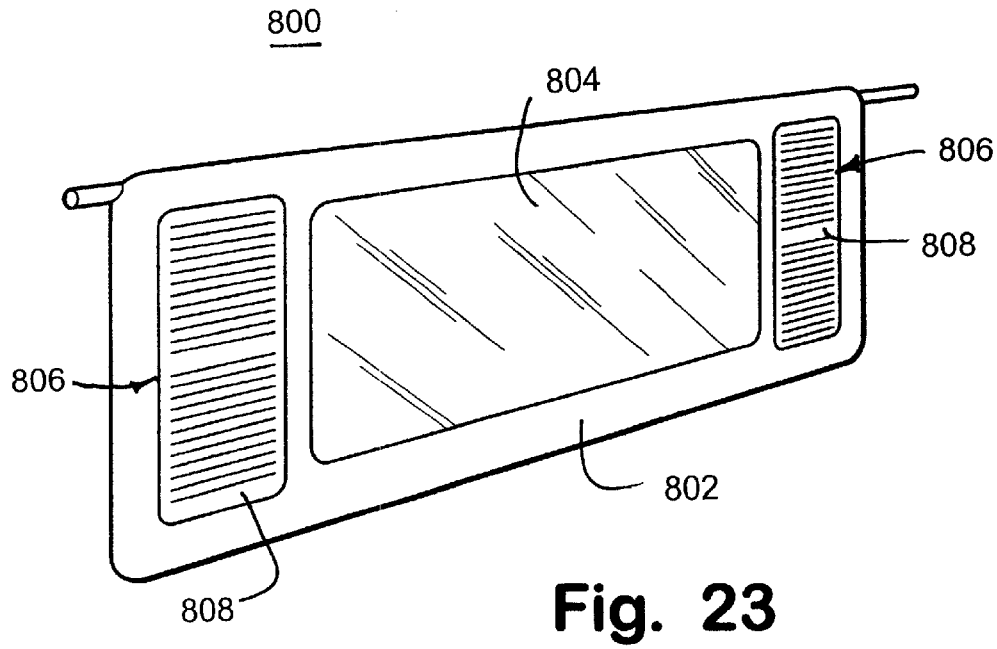
FIG. 23 is a perspective view of a sun visor constructed in accordance with one embodiment of the present invention.
Figure 24:
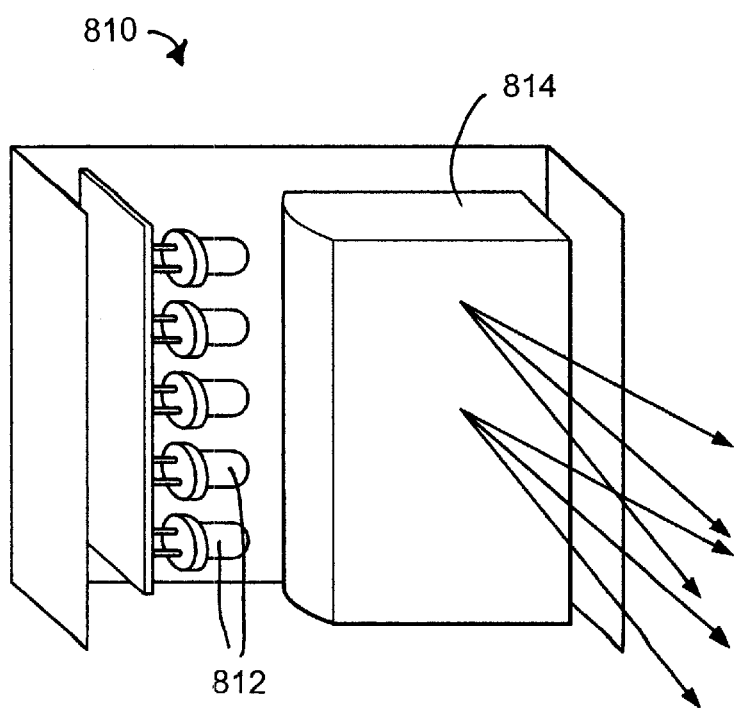
FIG. 24 is a perspective view of a light source for use in the sun visor assembly shown in FIG. 23 as constructed in accordance with the present invention.

By constructing CHMSL 700 in the manner illustrated, a very low profile, high intensity signal light is provided. The low profile of CHMSL 700 is particularly advantageous when mounting the CHMSL in the interior of the vehicle behind rear window 332. It will be appreciated, however, that structures similar to that shown in FIGS. 21 and 22 may be used to construct other signal lights or vehicle illuminators. For example, a particularly suitable application for a light source having the general structure shown in FIG. 21 is to utilize such a light source in a vehicle sun visor assembly 800 as shown in FIGS. 23 and 24. As illustrated, sun visor assembly 800 includes a visor body 802 having a vanity mirror 804 and two light sources 806 mounted on the rear-facing surface of visor body 806. Light sources 806 include a transparent plate or lens 808 and an assembly 810 (FIG. 24) that is similar to that shown in FIG. 21, except that assembly 810 may be turned on its side and the diffuser/collimator is selected to have 90 degree deviation rather than the 40 degree deviation that is preferred for the diffuser/collimator of CHMSL 700. Further, LEDs 812 in assembly 810 produce white light. Preferably, LEDs 812 include binary complementary LEDs such as those disclosed in the above-cited U.S. Pat. No. 5,803,579. Because diffuser/collimator 814 of assembly 810 thoroughly mixes the light projected into its edge from LEDs 812 prior to projecting the mixed light outward, the projected light from diffuser/collimator 814 will appear white to a viewer looking directly at its surface of projection even though different colored LEDs 812 are used to create the white light.

A second embodiment for a sun visor assembly 900 is shown in FIGS. 25–27. As shown, visor assembly 900 includes a visor body 902 having a vanity mirror 904 and light sources 906 mounted to a rear-facing surface thereof. A visor assembly 900 differs from visor assembly 800 shown in FIGS. 23 and 24 in that light sources 906 include an outer optical plate 908 that functions as a diffuser/collimator sheet. Further, LEDs 912 are mounted on a printed circuit board 910 so as to project light through a surface opposite the projection surface rather than through an edge. Again, LEDs 912 are preferably binary complementary LEDs.

Although various features and embodiments of the present invention have been disclosed as being used in particular combinations, it will be appreciated by those skilled in the art that some of the disclosed features may be implemented separately from one another or in combinations or subcombinations not expressly disclosed. For example, certain features of the system, such as the pulsing of lights during non-integration periods of the camera, may be implemented regardless of the particular manner in which the cameras or displays are physically mounted to the vehicle. Similarly, aspects of the invention relating to the physical mounting of the cameras and displays may be separately implemented regardless of the functionality or structure of the imaging system of which the cameras and displays are components.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

The invention claimed is:

1. A modular integrated vehicle rear window assembly comprising:
   a rear window;
   an opaque frit disposed on a peripheral region of said rear window
   a camera housing integrally mounted to an inner surface of said rear window behind a transparent zone formed in said frit; and a camera mounted in said camera housing so as to capture an image to the rear of the vehicle through said rear window and said transparent zone formed in said frit.

2. The modular integrated vehicle rear window assembly as defined in claim 1, wherein said rear window is made of tinted low transmittance privacy glass.

3. The modular integrated vehicle rear window assembly as defined in claim 1 and further including a windshield wiper mounted to said rear window, wherein said camera is mounted behind a wiper zone defined by the sweep of said wiper across the outer surface of said rear window.

4. The modular integrated vehicle rear window assembly as defined in claim 1 and further including a window washer, wherein said camera is mounted behind a wash zone defined by the area over which said washer dispenses washer fluid.

5. The modular integrated vehicle rear window assembly as defined in claim 1 and further including a defroster disposed on said rear window, wherein said camera is mounted behind a defroster zone defined by the area covered on said rear window by said defroster.

6. The modular integrated vehicle rear window assembly as defined in claim 1 and further including a radiation source mounted to the inner surface of said rear window for emitting radiation rearward of the vehicle.

7. The modular integrated vehicle rear window assembly as defined in claim 6, wherein said radiation source emits IR radiation.

8. The modular integrated vehicle rear window assembly as defined in claim 6, wherein said radiation source emits white light.

9. The modular integrated vehicle rear window assembly as defined in claim 6, wherein said radiation source emits light to which said camera is sensitive.

10. The modular integrated vehicle rear window assembly as defined in claim 1, wherein said camera captures images at periodic intervals and said radiation source is activated to emit radiation at the same periodic intervals.

11. The modular integrated vehicle rear window assembly as defined in claim 1, wherein said rear window is made of privacy glass having a transmittance that is highest in a spectral region corresponding to the spectral region of highest sensitivity of said camera.

12. The modular integrated vehicle rear window assembly as defined in claim 1 and further including a light source mounted to the inner surface of said rear window.

13. The modular integrated vehicle rear window assembly as defined in claim 12, wherein said camera captures images at periodic intervals and said light source is periodically activated to emit light at during those intervals when said camera is not capturing images.

* * * * *